(12) United States Patent
Morgan et al.

(10) Patent No.: US 12,301,247 B2
(45) Date of Patent: May 13, 2025

(54) DRIVER CIRCUITRY

(71) Applicant: Cirrus Logic International Semiconductor Ltd., Edinburgh (GB)

(72) Inventors: Ross C. Morgan, Edinburgh (GB); Tahir Rashid, Tewkesbury (GB); Jonathan Taylor, London (GB)

(73) Assignee: Cirrus Logic Inc., Austin, TX (US)

( * ) Notice: Subject to any disclaimer, the term of this patent is extended or adjusted under 35 U.S.C. 154(b) by 170 days.

(21) Appl. No.: 18/182,020

(22) Filed: Mar. 10, 2023

(65) Prior Publication Data

US 2023/0216515 A1     Jul. 6, 2023

Related U.S. Application Data

(63) Continuation of application No. 17/380,176, filed on Jul. 20, 2021, now Pat. No. 11,658,673.
(Continued)

(30) Foreign Application Priority Data

Feb. 23, 2021 (GB) .................................... 2102561

(51) Int. Cl.
| | |
|---|---|
| *H03M 1/10* | (2006.01) |
| *G05F 3/26* | (2006.01) |
| *H02J 7/00* | (2006.01) |
| *H02M 3/156* | (2006.01) |
| *H02P 7/29* | (2016.01) |
| *H02P 7/295* | (2016.01) |

(Continued)

(52) U.S. Cl.
CPC .......... *H03M 1/1071* (2013.01); *G05F 3/262* (2013.01); *H02J 7/0063* (2013.01); *H02J 7/007182* (2020.01); *H02M 3/156* (2013.01); *H02P 7/29* (2013.01); *H02P 7/295* (2013.01); *H03K 7/08* (2013.01); *H03M 1/504* (2013.01)

(58) Field of Classification Search
CPC ..... H03M 1/1071; H03M 1/504; H02P 7/295; H02P 7/29; H02J 7/007182; H02J 7/0063; H02M 3/156; G05F 3/262; H03K 7/08
See application file for complete search history.

(56) References Cited

U.S. PATENT DOCUMENTS

| | | |
|---|---|---|
| 5,281,900 A | 1/1994 | Park |
| 5,838,124 A | 11/1998 | Hill |

(Continued)

FOREIGN PATENT DOCUMENTS

| | | |
|---|---|---|
| CA | 2925348 A1 | 4/2015 |
| EP | 2685627 A2 | 1/2014 |

(Continued)

OTHER PUBLICATIONS

Combined Search and Examination Report under Sections 17 and 18(3), UKIPO, Application No. GB2102561.4, mailed Aug. 17, 2021.

(Continued)

*Primary Examiner* — Khai M Nguyen
(74) *Attorney, Agent, or Firm* — Jackson Walker L.L.P.

(57) ABSTRACT

The present disclosure relates to circuitry comprising: digital circuitry configured to generate a digital output signal; and monitoring circuitry configured to monitor a supply voltage to the digital circuitry and to output a control signal for controlling operation of the digital circuitry, wherein the control signal is based on the supply voltage.

26 Claims, 22 Drawing Sheets

Related U.S. Application Data

(60) Provisional application No. 63/077,159, filed on Sep. 11, 2020, provisional application No. 63/059,504, filed on Jul. 31, 2020.

(51) Int. Cl.
*H03K 7/08* (2006.01)
*H03M 1/50* (2006.01)

(56) References Cited

U.S. PATENT DOCUMENTS

| | | | |
|---|---|---|---|
| 5,856,736 | A | 1/1999 | Rotunda et al. |
| 6,100,654 | A | 8/2000 | Izukawa et al. |
| 8,324,845 | B2 | 12/2012 | Suzuki et al. |
| 9,893,632 | B2 | 2/2018 | Freeman et al. |
| 11,735,942 | B2 * | 8/2023 | Mackay .............. H01M 10/0525 320/127 |
| 2006/0219471 | A1 | 10/2006 | Hayashi |
| 2009/0231052 | A1 | 9/2009 | Li |
| 2012/0326643 | A1 | 12/2012 | Brannen |
| 2013/0342177 | A1 * | 12/2013 | Slattery .................. H02M 1/00 323/234 |
| 2014/0210534 | A1 | 7/2014 | Wang et al. |
| 2014/0265986 | A1 | 9/2014 | Gebregergis et al. |
| 2015/0155807 | A1 | 6/2015 | Lee et al. |
| 2015/0333676 | A1 | 11/2015 | Liu |
| 2016/0126851 | A1 | 5/2016 | Freeman et al. |
| 2017/0279393 | A1 | 9/2017 | Kawashima et al. |
| 2018/0123491 | A1 | 5/2018 | Jo et al. |
| 2020/0036352 | A1 | 1/2020 | Zhu et al. |
| 2022/0038087 | A1 | 2/2022 | Rashid et al. |

FOREIGN PATENT DOCUMENTS

| | | |
|---|---|---|
| GB | 1505829 | 3/1978 |
| GB | 1577537 | 10/1980 |
| GB | 2254941 A | 10/1992 |
| GB | 2425903 A | 11/2006 |
| GB | 2519101 A | 4/2015 |
| TW | 201419749 A | 5/2014 |
| TW | 201521351 A | 6/2015 |
| WO | 8002346 A1 | 10/1980 |
| WO | 2005086341 A | 9/2005 |
| WO | 2008147108 A1 | 12/2008 |
| WO | 2013111587 A2 | 8/2013 |
| WO | 2015051248 A1 | 4/2015 |

OTHER PUBLICATIONS

Combined Search and Examination Report under Sections 17 and 18(3), UKIPO, Application No. GB2105789.8, mailed Feb. 17, 2022.
International Search Report and Written Opinion of the International Searching Authority, International Application No. PCT/GB2021/052347, mailed Apr. 4, 2022.
Search Report, Taiwan Intellectual Property Office, Application No. 110133754, issued Jun. 8, 2022.
Combined Search and Examination Report, United Kingdom Intellectual Property Office, Application No. GB2213777.2, mailed Oct. 6, 2022.
Search Report under Section 17(6), UKIPO, Application No. GB2213777.2, claims 22-34 mailed Mar. 17, 2023.
Search Report under Section 17(6), UKIPO, Application No. GB2213777.2, claims 33-48 mailed Mar. 17, 2023.
Examination Report under Section 18(3), UKIPO, Application No. GB2213777.2, mailed Mar. 17, 2023.
Search Report, Taiwan Patent Office, Application No. 112111305, dated Dec. 17, 2023.

* cited by examiner

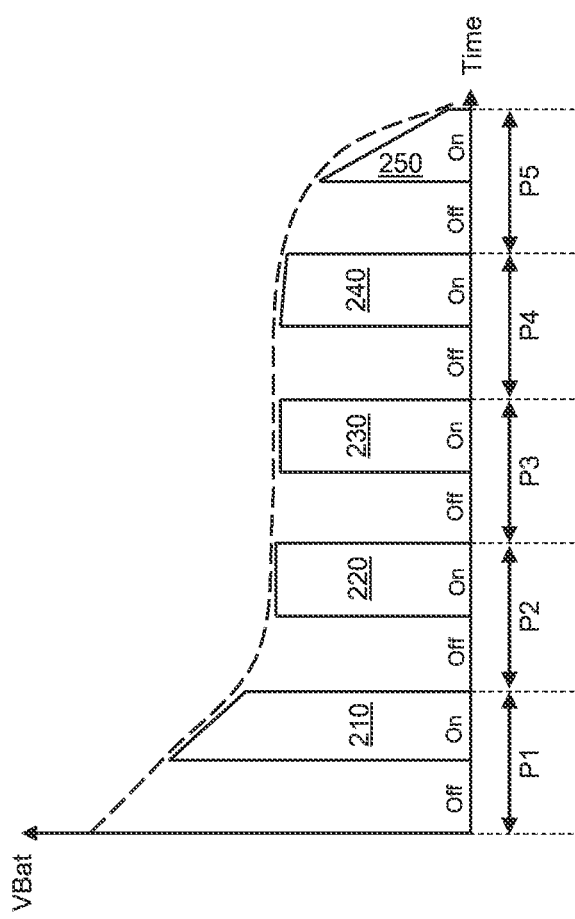

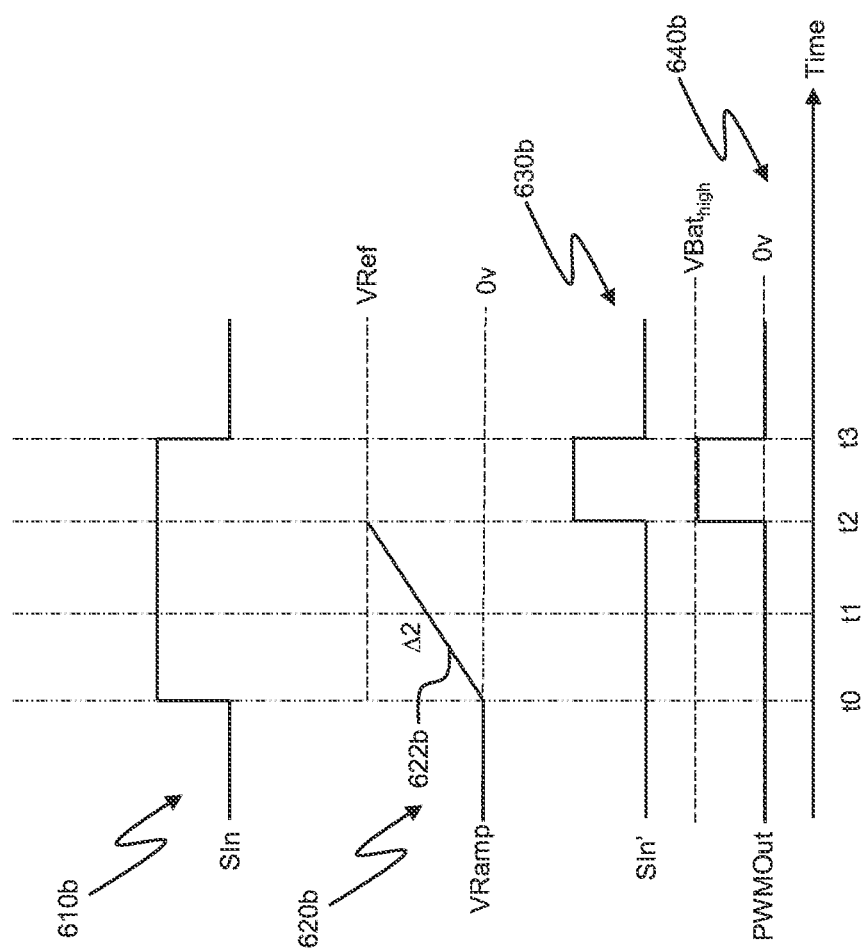

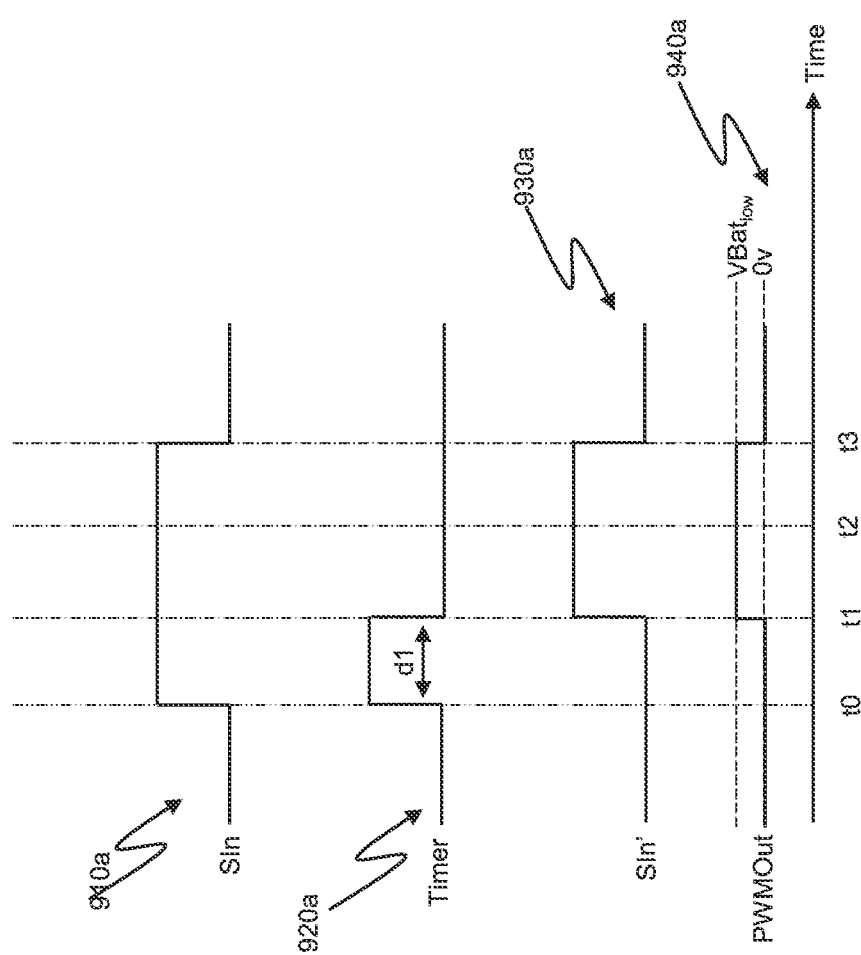

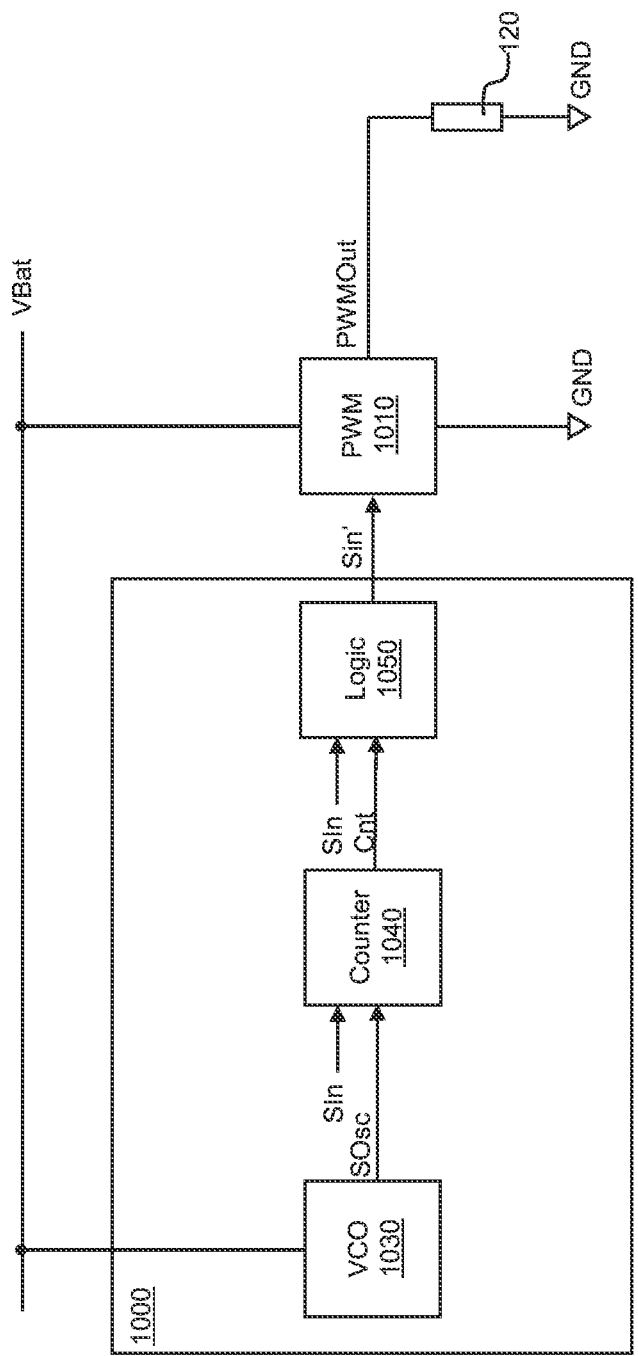

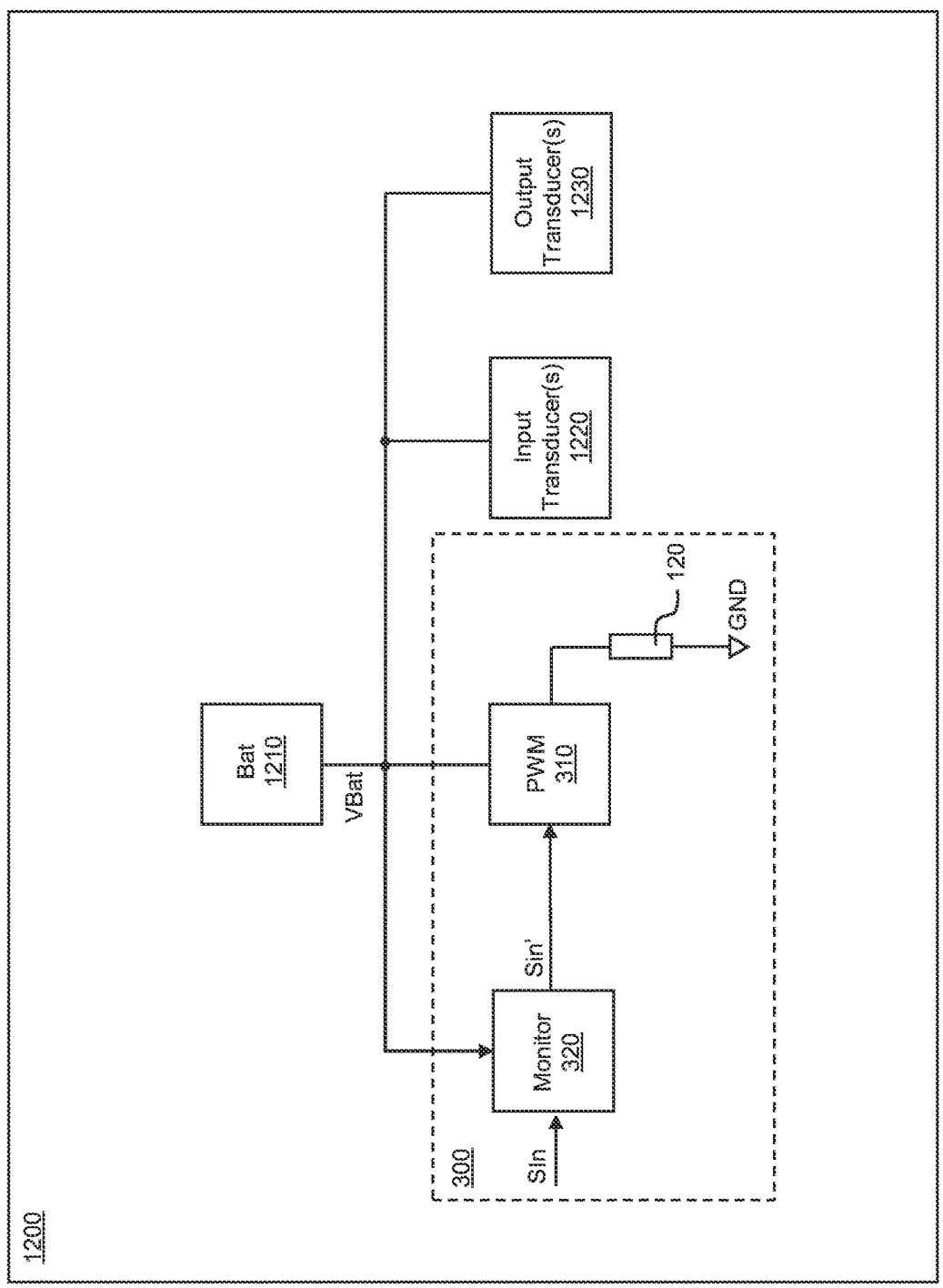

DRIVER CIRCUITRY

The present disclosure is a continuation of U.S. Non-Provisional patent application Ser. No. 17/380,176, filed on Jul. 20, 2021, which claims priority to U.S. Provisional Patent Application Ser. No. 63/059,504, filed on Jul. 31, 2020, U.S. Provisional Patent Application Ser. No. 63/077,159, filed on Sep. 11, 2020, and United Kingdom Patent Application No. 2102561.4, filed on Feb. 23, 2021, each of which is incorporated by reference herein in its entirety.

FIELD

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The example embodiments in this disclosure relate to analogue and/or digital circuitry for controlling or driving a transducer and/or electronic circuitry.

BACKGROUND

One way of controlling the speed of a transducer such as a DC motor for example is to adjust a supply voltage applied to the motor. Thus, at higher supply voltages the speed of the motor is higher, whereas at lower supply voltages the speed of the motor is lower, in the absence of any load on the motor. However, controlling the speed in this way can limit the power and/or torque of the motor, and makes the speed of the motor sensitive to the load on the motor. Further, as the motor speed is dependent upon the supply voltage, any change in the supply voltage (e.g. a reduction in the supply voltage arising, for example, as a result of discharging of a battery that provides the supply voltage) will also affect the motor speed.

An alternative approach of controlling the speed of a transducer such as a DC motor for example is to use a digital signal such as, for example, a pulse width modulated (PWM) or pulse duration modulated (PDM) drive signal to control the speed of a DC motor. The speed of the motor is controlled by varying the duty cycle of a digital drive signal output by digital driver circuitry to the motor, such that the motor speed is effectively controlled by the RMS (root-mean squared) value of the digital drive signal. In an open-loop system of motor control in which the supply voltage varies, e.g. where the supply voltage to the digital driver circuitry is provided by a power source such as a battery for example, the speed is a function of both the duty cycle of the digital drive signal and the supply voltage, since as the supply voltage changes, the RMS value of the digital drive signal changes accordingly.

In another example embodiment, one way of controlling the power efficiency of a transducer and driver arrangement such as an audio speaker system for example is to adjust a supply voltage applied to the audio speaker driver. The audio speaker driver may drive the audio speaker using analogue drive signals and circuitry such as those associated with Class G and/or Class H amplifiers for example, as will be understood by those of ordinary skill in the art. In such an analogue scenario, a larger input signal would require a larger supply voltage so as to avoid clipping of the output signal but would require more energy and a smaller input signal would require a smaller supply voltage thereby saving energy and resulting in greater power efficiency of a transducer and driver arrangement.

Furthermore, transducers such as motor drivers, audio drivers and haptic drivers for example can demand sudden and potentially large transient currents from batteries such as Li-ion batteries. The independent and cumulative effect of these transient current demands can cause for example: premature system brownout as the battery supply level transiently drops below its brownout threshold; and/or fool circuitry and other components and/or systems of a host device incorporating the circuitry into believing that the battery has reached its end-of-charge threshold when in fact it has not. Additionally, the transient demands from one transducer may cause a transient dip in the battery supply with the result that the output power supplied to other transducers may be affected. Moreover, the cumulative power dissipation of these concurrent current demands can cause undesirable thermal heating of circuitry and/or other components or systems of a host device incorporating the circuitry.

To mitigate the problem of the motor speed being dependent upon the supply voltage level as well as the duty cycle of the digital drive signal, the supply voltage to the digital drive circuitry may be regulated by means of voltage regulator circuitry such as DC-DC converter circuitry, low drop-out (LDO) regulator circuitry or the like. However, the use of such additional voltage regulator circuitry increases, for example, the physical size, number of components and cost of a system for controlling a DC motor, and can also reduce the power efficiency of the system due to inefficiencies in the additional voltage regulator circuitry and necessary headroom requirements of the voltage regulator circuitry.

Digital drive signals can also be used to drive other transducers, such as LEDs (light emitting diodes), haptic transducers, resonant actuators and the like, and issues similar to those outlined above can arise when using digital and/or analogue drive signals in such applications.

SUMMARY

According to a first aspect, the invention provides circuitry comprising:
digital circuitry configured to generate a digital output signal; and
monitoring circuitry configured to monitor a supply voltage to the digital circuitry and to output a control signal for controlling operation of the digital circuitry, wherein the control signal is based on the supply voltage.

The digital circuitry may be operative to control a parameter of a digital output signal based on the control signal.

The digital circuitry may be operative to control a pulse width of a pulse of the digital output signal based on the control signal to maintain a given average voltage per period of the digital output signal to compensate, at least partially, for a change in a magnitude of the supply voltage.

The circuitry may be configured to increase the pulse width of the pulse of the digital output signal to compensate, at least partially, for a decrease in the magnitude of the supply voltage.

The circuitry may be configured to decrease the pulse width of the pulse of the digital output signal to compensate, at least partially, for an increase in the magnitude of the supply voltage.

The monitoring circuitry may be configured to receive an input signal for the digital circuitry and to output a modified input signal to the digital circuitry as the control signal, and the digital circuitry may be configured to generate the digital output signal based on the modified input signal.

The monitoring circuitry may comprise:
waveform generator circuitry configured to generate a voltage having an amplitude that changes over time based on a magnitude of the supply voltage;
comparator circuitry configured to compare the voltage to a reference voltage and to output a comparison signal when the voltage reaches the reference voltage; and
logic circuitry configured to receive the input signal and the comparison signal and to generate a modified input signal for the digital circuitry based on the input signal and the comparison signal.

The waveform generator circuitry may be configured such that a rate of increase of the voltage is inversely proportional to the magnitude of the supply voltage.

The waveform generator circuitry may be configured to generate a ramp voltage.

The monitoring circuitry may comprise:
a capacitor;
voltage-to-current converter circuitry configured to generate a first current based on the supply voltage;
current generator circuitry configured to generate a constant current for charging the capacitor; and
current mirror circuitry; and
a current control transistor, wherein the current mirror circuitry is configured to mirror the first current to a control terminal of the current control transistor, such that the current control transistor controls a portion of the constant current that is diverted away from the capacitor.

The monitoring circuitry may comprise:
analogue-to-digital converter (ADC) circuitry configured to generate a digital output signal based on the supply voltage;
timer circuitry configured to:
  receive the input signal and the digital output signal;
  commence timing a time period on detection of a feature of the input signal, wherein a duration of the time period is based on the digital output signal; and
  output a timer output signal at the end of the time period; and
logic circuitry configured to receive the input signal and the timer output signal and to generate a modified input signal for the PWM circuitry based on the input signal and the timer output signal.

The timer circuitry may be configured such that the duration of the time period is inversely proportional to a magnitude of the supply voltage.

The feature of the input signal may be a rising edge of a pulse of the input signal.

The monitoring circuitry may comprise:
voltage controlled oscillator (VCO) circuitry configured to generate an oscillating output signal having a frequency that is based on the supply voltage;
counter circuitry configured to:
  receive the input signal and the oscillating output signal;
  commence a count of cycles of the oscillating signal on detection of a feature of the input signal; and
  output a counter output signal when the count reaches a count value that represents a magnitude of the supply voltage; and
logic circuitry configured to receive the input signal and the counter output signal and to generate a modified input signal for the PWM circuitry based on the input signal and the timer output signal.

The VCO circuitry may be configured such that the frequency of the oscillating output signal is inversely proportional to a magnitude of the supply voltage.

The feature of the input signal may be a rising edge of a pulse of the input signal.

The digital circuitry may comprise pulse-width modulation (PWM) circuitry configured to generate a PWM output signal.

According to a second aspect, the invention provides integrated circuitry comprising the circuitry of the first aspect.

According to a third aspect, the invention provides a system comprising the circuitry of any one of first aspect and an output transducer configured to receive the digital output signal from the digital circuitry.

The output transducer may comprise one or more of a motor, a light emitting diode (LED) or LED array, a haptic actuator, a resonant actuator and/or a servo.

According to a fourth aspect, the invention provides a device comprising the circuitry of the first aspect, wherein the device comprises a battery powered device, a computer game controller, a virtual reality (VR) or augmented reality (AR) device, eyewear, a mobile telephone, a tablet or laptop computer, an accessory device, headphones, earphones or a headset.

According to a fifth aspect, the invention provides monitoring circuitry configured to receive a supply voltage applied to digital circuitry and an input signal for the digital circuitry, the monitoring circuitry configured to generate a modified input signal for the digital circuitry based on the input signal and the supply voltage.

According to a sixth aspect, the invention provides digital driver circuitry comprising:
digital output circuitry; and
monitoring circuitry, wherein the monitoring circuitry is configured to receive an input signal for the digital output circuitry and a supply voltage applied to the digital output driver circuitry and to generate a modified input signal for the digital output circuitry based on the input signal and the supply voltage.

According to a seventh aspect, the invention provides digital control circuitry comprising:
digital output driver circuitry configured to generate a digital signal based on an input signal; and
circuitry configured to introduce a time offset into the digital signal, wherein the time offset is based on a magnitude of a supply voltage applied to the digital output driver circuitry.

According to an eighth aspect, the invention provides circuitry comprising:
a digital signal modulator configured to output a modulated digital signal; and
circuitry configured to monitor a supply voltage to the modulator and to output a control signal for controlling the modulator, wherein the control signal is based on the supply voltage.

According to a ninth aspect, the invention provides a digital signal modulator configured to output a modulated digital signal comprising:
circuitry configured to monitor a supply voltage to the modulator and to output a control signal for controlling the modulated signal, wherein the control signal is based on the supply voltage.

According to a tenth aspect, the invention provides circuitry for driving a load using a digital signal, wherein the circuitry is configured to condition, control or adjust a width of one or more digital pulses to compensate for changes in a supply voltage supplied to a digital modulator of the circuitry in order to maintain a consistent average voltage per period of the digital signal for a given load condition.

According to an eleventh aspect, the invention provides a system comprising:

a plurality of driver circuits, each configured to output a drive signal for driving a load, wherein the drive signal is based on an input signal; and
  a controller configured to control a parameter of one or more of the drive signals to compensate, at least partially, for a change in a component of the system.

The parameter of the one or more of the drive signals may comprise a pulse width or a pulse amplitude of a digital drive signal output by the one or more of the plurality of driver circuits.

The system may further comprise a power supply for providing a supply voltage to each of the plurality of driver circuits. The change in the component of the system may comprise a change in the supply voltage.

The power supply may comprise a battery, and the change in the component of the system may comprise a change in a parameter of the battery.

The parameter of the battery may comprise one or more of:
  an output voltage of the battery;
  a state of charge of the battery;
  a state of health of the battery; and
  a temperature of the battery.

The system may further comprise a voltage regulator. The change in the component of the system may comprise a change in an output voltage of the voltage regulator.

The change in the component of the system may comprise a change in a parasitic element of the system.

The parasitic element may comprise a parasitic resistance.

The change in the component of the system may comprise a change in temperature of the component.

The system may comprise one or more thermal monitors for providing thermal information to the controller.

The change in the component of the system may comprise a change in a parameter of an input signal.

The system may comprise one or more voltage monitors for monitoring a battery output voltage and/or a regulator output voltage.

The system may comprise one or more impedance monitors for measuring or estimating an impedance of a battery.

The one or more impedance monitors may be configured to measure or estimate the impedance of the battery based on one or more characteristics of the battery.

The one or more characteristics of the battery may comprise one or more of a state of charge, a state of health, a temperature, a parasitic element, a sense resistance and/or a battery resistance.

The controller may be configured to estimate, calculate or otherwise determine a predicted power demand of each drive signal based on one or more parameters of the system.

The one or more parameters of the system may comprise:
  an amplitude level of the input signal on which the drive signal is based;
  a characteristic of a load driven by the drive signal;
  a transient gradient for estimation of inrush current;
  a frequency;
  an average power; and/or
  a transducer efficiency.

The controller may be configured to control the parameter of the one or more of the drive signals based on the predicted power demand of the drive signals or a subset of the drive signals.

The controller may be configured to calculate, estimate or otherwise determine a total predicted power demand, and to output a signal indicative of the total predicted power demand to a battery charger controller.

The battery charger controller may be configured to adjust a battery charge current based on the signal indicative of the total predicted power demand.

According to a twelfth aspect, the invention provides a system comprising:

a plurality of driver circuits, each configured to output a drive signal for driving a load;
  a power supply for providing a supply voltage to the plurality of driver circuits; and
  a controller configured to condition, control or adjust a parameter of one or more of the drive signals based on a level of the supply voltage and an indication of an expected transient load in the system.

According to a thirteenth aspect, the invention provides system comprising:

a power regulator or controller associated with a transducer;
  one or more processors or controllers for controlling the power regulator or controller; and
  a lookahead controller configured to monitor control and/or data signals from the one or more processors or controllers of the system, the lookahead controller being configured to adjust a transducer output power based on a supply voltage level and the monitored control and/or data signals.

The lookahead controller may be configured to adjust the transducer output power to:
  mitigate or avoid a brownout condition; and/or
  provide a consistent output level; and/or
  reduce a cumulative output power demand.

According to a fourteenth aspect, the invention provides circuitry comprising:

one or more signal paths, each of the one or more signal paths being configured to carry a signal for driving a load;
  controller circuitry configured to receive data from at least one of the one or more signal paths and to output control data to one or more of the one or more signal paths for controlling one or more characteristics of the signal carried by the one or more of the one or more signal paths.

The data received by the controller circuitry from the at least one of the one or more signal paths may comprise voltage data and/or thermal data and/or signal data.

The controller circuitry may comprise lookahead controller circuitry.

The one or more signal paths may comprise an analogue signal path and/or a digital signal path.

Each of the one or more signal paths may comprise transducer driver circuitry.

The controller circuitry may be configured to output control data to limit a signal power of the load associated with the one or more of the one or more signal paths.

The control data may be configured to cause attenuation of the signal carrier by the one or more of the one or more signal paths.

The controller circuitry may be configured to output control data to delay a signal in one or more of the one or more signal paths.

According to a fifteenth aspect, the invention provides circuitry comprising:
one or more driver signal paths, each associated with a load, for supplying a drive signal to the load; and
lookahead circuitry configured to:
receive signal data from a driver signal path;
estimate a power demand of a load coupled to the driver signal path based on the signal data and/or a characteristic of the load;
predict a future supply voltage based, at least in part, on the estimated power demand a power supply parameter; and
based on the predicted future supply voltage, adjust a parameter of a signal in one or more of the driver signal paths.

The power supply parameter may comprise one or more of:
a measure of a current battery supply level;
a supply decoupling capacitance; and
battery RC dynamics.

The battery RC dynamics may be based on a battery parameter, the battery parameter comprising one or more of:
a state of charge;
a state of health; and
a temperature.

According to a sixteenth aspect, the invention provides circuitry receiving a voltage derived from a voltage supply for controlling one or more signal paths comprising a controller configured to receive:
voltage data relating to at least said circuitry; and/or
thermal data relating to at least said circuitry; and/or
signal data from said one or more signal paths, wherein each signal path comprises
a respective transducer driver,
wherein the circuitry is configured to output control data to said one or more signal paths for controlling one or more characteristics of respective signals in said one or more respective signal paths, wherein the controller is a predictive controller for controlling, based on one or more of said received data, one or more characteristics of the respective signals in said one or more respective signal paths before they are output from their respective transducer drivers so as to mitigate or avoid an adverse voltage and/or thermal and/or signal condition relating to at least said circuitry.

The adverse voltage condition may be a voltage supply brownout condition.

The adverse thermal condition may be an undesirable thermal heating of said circuitry.

The adverse thermal condition may be an undesirable thermal heating of other components or systems of a host device incorporating the circuitry.

The voltage data may be derived from a battery monitor and/or a voltage monitor.

The battery monitor may be configured to monitor a battery parameter.

The battery parameter may comprise one or more of a state of charge of the battery, a state of health of the battery and/or parasitic elements of and/or associated with the battery.

The thermal data may be derived from one or more thermal monitors.

The signal data may be derived from one or more points along said one or more signal paths.

The control data may control at least one signal parameter in a respective signal path. The controlled at least one signal parameter may be input to the controller.

The control data may control a gain of at least one signal in a respective signal path.

The circuitry may provide a consistent power output.

The controller may output a total predicted power demand signal.

The total predicted power demand signal may be input to a battery controller.

BRIEF DESCRIPTION OF THE DRAWINGS

Embodiments of the invention will now be described, strictly by way of example only, with reference to the accompanying drawings, of which:
FIG. 2 is a graph illustrating a digital signal output by the circuitry of FIG. 1a over time;
FIGS. 6a and 6b are timing diagrams illustrating the operation of the circuitry of FIG. 5;
FIGS. 9a and 9b are timing diagrams illustrating the operation of the circuitry of FIG. 8;
FIG. 10 is a schematic diagram illustrating further alternative example monitoring circuitry;
FIG. 12 is a schematic diagram illustrating a host device incorporating the circuitry of FIG. 3.

DETAILED DESCRIPTION

Figure 1A:
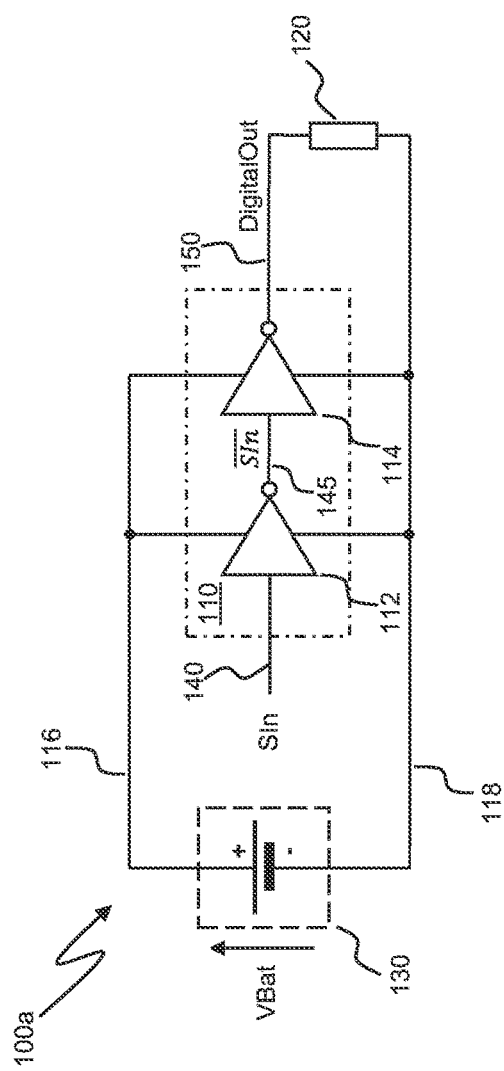
FIG. 1a is a schematic diagram illustrating circuitry for driving a transducer using a digital signal.

FIG. 1a is a simplified schematic diagram of circuitry for driving a transducer using a digital, for example PWM, signal. The circuitry, shown generally at 100a, includes digital output driver circuitry 110 coupled to a load 120. The load 120 may be, for example, a transducer such as a motor, LED (or LED array), a servo, a haptic transducer, a resonant actuator or the like. Alternatively, the load 120 may be, for example, electronic circuitry such as an audio amplifier, for example.

The digital output driver circuitry 110 receives a supply voltage VBat from a power supply, which in this example is a battery 130, but which could equally be a power supply or a power converter, regulator or the like whose output voltage can vary due to transient loads from other components or systems of a host device incorporating the circuitry 100.

The digital output driver circuitry 110 in this example comprises first and second series connected inverters, respectively 112 and 114. The first inverter 112 receives at its input node 140 a digital input signal SIn and outputs at its output node 145 the digital inverse signal of SIn, i.e. $\overline{\text{SIn}}$. The second inverter 114 receives at its input node 140 the inverse digital signal $\overline{\text{SIn}}$ and outputs at its output node 150 an inverse digital output signal DigitalOut. Thus, the digital output signal DigitalOut has the same logic state or level as the digital input signal SIn.

Figure 1B:
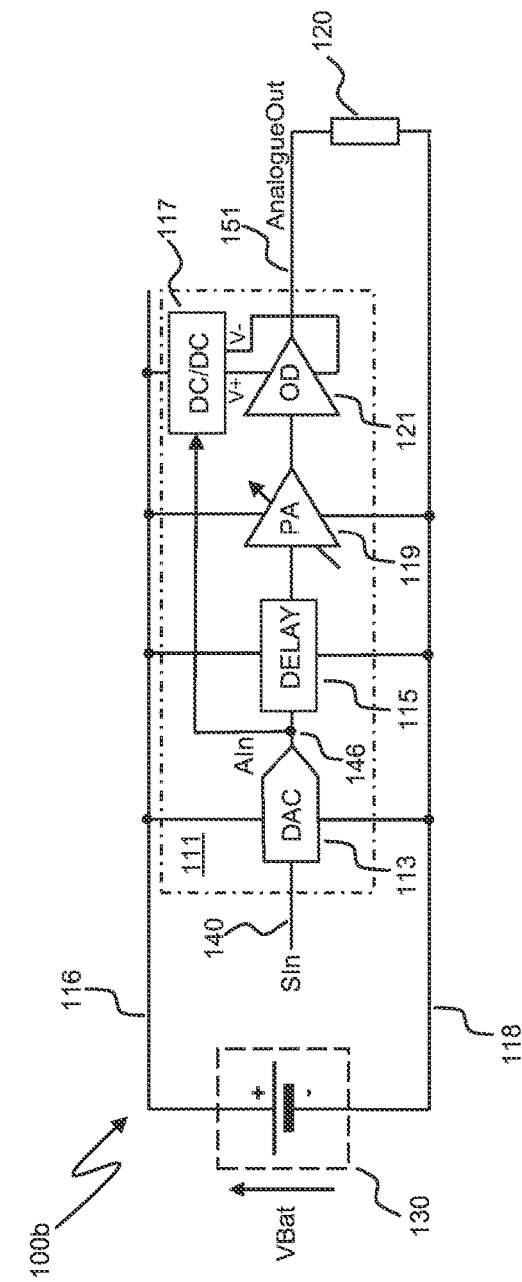
FIG. 1b is a schematic diagram illustrating circuitry for driving a transducer using an analogue signal.

FIG. 1b is a simplified schematic diagram of circuitry for driving a transducer using an analogue signal AnalogueOut that is derived, in this example embodiment, from a digital signal SIn. The circuitry, illustrated generally at 100b, includes mixed signal, i.e. analogue and digital signal, output driver circuitry 111 coupled to a load 120. The load 120 may be, for example, a transducer such as an audio transducer, a speaker, a haptic transducer, an ultrasonic transducer, or the like. Alternatively, the load 120 may be, for example, electronic circuitry such as an audio amplifier, for example.

The mixed signal output driver circuitry 111 receives a supply voltage VBat from a power supply as described in respect of FIG. 1a.

The mixed signal output driver circuitry 111 in this example comprises a digital-to-analogue converter (DAC) 113 which receives at its input node 140 a digital input signal SIn and outputs at its output node 146 an analogue equivalent input signal AIn. The analogue equivalent input signal AIn is input to delay circuitry 115 in the signal path and to a DC/DC converter 117 such as a charge pump for example. The output of the delay circuitry 115 is input in this example embodiment to a pre-amplifier 119 in the signal path and the output of the pre-amplifier 119 is input to an output driver or power amplifier 121 in the signal path. The output driver or power amplifier 121 receives a bipolar supply voltage from the DC/DC converter 117 which receives its supply voltage from the battery 130. The bipolar voltage (V+, V−) supplied to the output driver 121 is controlled based on a parameter, such as amplitude for example, of the equivalent input signal AIn such that the voltage supplied to the output driver 121 is controlled as a function of a parameter of the equivalent input signal AIn. The output signal AnalogueOut output at the output node 151 of the power amplifier 121 is used to drive the load 120. The arrangement and operation of such mixed signal output driver circuitry 111 is well known and understood by persons of ordinary skill in the art. It will also be appreciated and understood by persons of ordinary skill in the art that even though the circuitry illustrated at 100b, includes mixed signal, i.e. analogue and digital signal, output driver circuitry 111, the DAC 113 may be part of some other circuitry (not illustrated) such that the output driver circuitry 111 is analogue output driver circuitry 111 that receives as an input signal the analogue equivalent input signal AIn. Furthermore, the delay circuitry 115 may be in the digital part of the signal path rather than in the analogue part of the signal path, as illustrated in FIG. 1b, upstream of the DAC 113 and the DC-DC converter receives a digital lookahead signal rather than an analogue lookahead signal.

To maintain a constant average voltage per PWM period (and thus to maintain a consistent output of the load 120, e.g. a consistent motor speed, in the case where the load 120 is a DC motor, or to maintain a consistent light intensity, in the case where the load 120 is an LED or an LED array), the PWM output driver circuitry 110 generates the PWM output signal PWMOut with a constant duty cycle or mark-to-space ratio. This approach is effective when the supply voltage VBat remains constant. However, if the supply voltage VBat changes, e.g. decreases as a result of discharge of the battery 130 over time and/or as a result of other components, systems, transients or circuitry of the host device drawing current from the battery 130, the average voltage of the PWM output signal PWMOut over a PWM signal period also falls, as will now be explained with reference to FIG. 2.

FIG. 2 illustrates example digital, for example PWM, pulses 210-250 output by the PWM output driver circuitry 110 as the supply voltage VBat (shown in dashed line in FIG. 2) decreases over a plurality of PWM time periods P1-P5. It is to be understood that FIG. 2 is a highly simplified representation of the PWM pulses 210-250, for illustrative purposes only. As will be appreciated by those of ordinary skill in the art, in a real application the frequency of a PWM signal will be very much higher, e.g. of the order of kilohertz or megahertz.

As will be appreciated by those of ordinary skill in the art, the average voltage (or, equivalently, the average power) supplied by the PWM output driver circuitry 110 to the load 120 during a first PWM period P1 is represented by the area of the pulse 210. Similarly, the average voltage supplied by the modulator circuitry 110 to the load 120 during each of the PWM periods P2-P5 is represented by the area of the pulses 220-250 respectively.

If the supply voltage VBat were constant then the average voltage supplied to the load 120 by the PWM output driver circuitry 110 during each of the PWM periods P1-P5 would be the same, so the pulses 210-250 would all have the same area. However, in the illustrated example the supply voltage VBat decreases over time, and thus although the width of each of the pulses 210-250 (i.e. the on-time in each PWM period) is the same, the pulses 210-250 are not all of the same voltage magnitude (i.e. are not all of the same amplitude or height), and so the average voltage supplied to the load 120 per PWM period is not constant. This leads to inconsistency in the output signal PWMOut that drives the load 120, which leads to, for example, an inconsistent motor speed in the case where the transducer 130 is a DC motor, or an inconsistent light intensity in the case where the load 120 is an LED or an LED array.

Figure 3:
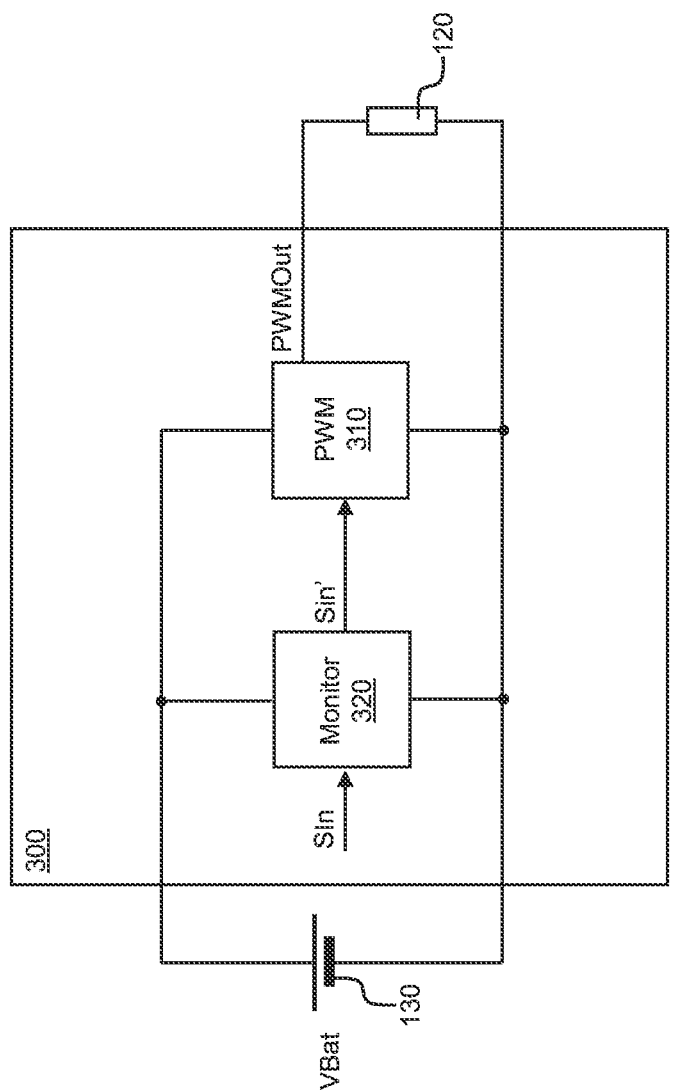
FIG. 3 is a schematic diagram illustrating example circuitry for driving a transducer using a digital signal according to the present disclosure.

FIG. 3 is a schematic representation of circuitry for driving a load 120 using a digital, for example PWM, signal which is configured to condition, control or adjust a parameter of the digital signal, such as the width of one or more PWM pulses for example, to compensate for changes in the supply voltage to a PWM modulator 310 in order to maintain a consistent average voltage per PWM period and thus consistent load output performance.

The circuitry, shown generally at 300 in FIG. 3, includes elements in common with the circuitry 100 of FIG. 1a. Such common elements are denoted by common reference numerals and will not be described in detail here.

The circuitry 300 includes PWM output driver circuitry 310, which is the same as the PWM output driver circuitry 110 of FIG. 1a in construction and operation, and thus will not be described in detail here.

The circuitry 300 further includes monitoring circuitry 320 which is configured to receive the supply voltage VBat and the input signal SIn and to output a modified input signal SIn', based on a level (e.g. an amplitude) of the supply voltage VBat and on the input signal SIn, to the PWM output driver circuitry 310. Operation of the PWM output driver circuitry 310 is thus controlled based on the modified input signal SIn', as will be described in more detail below.

The PWM output driver circuitry 310 in the illustrated example is configured to receive the modified input signal SIn from the monitoring circuitry 320 and to output an output PWM signal PWMOut based on the modified input signal SIn'. The modified input signal SIn' can therefore be regarded as a control signal that is based on the supply voltage VBat and the input signal SIn and that is output by the monitoring circuitry 320 for controlling the operation of the PWM output driver circuitry 310. Thus, the circuitry 300 can control or adapt the pulse width of one or more pulses of the PWM output signal PWMOut so as to maintain a required average voltage (or equivalently, a required average output power) per PWM period in response to a changing supply voltage VBat, in order to maintain a required load condition (e.g. a required motor speed, where the load 120 is a motor).

Figure 4:
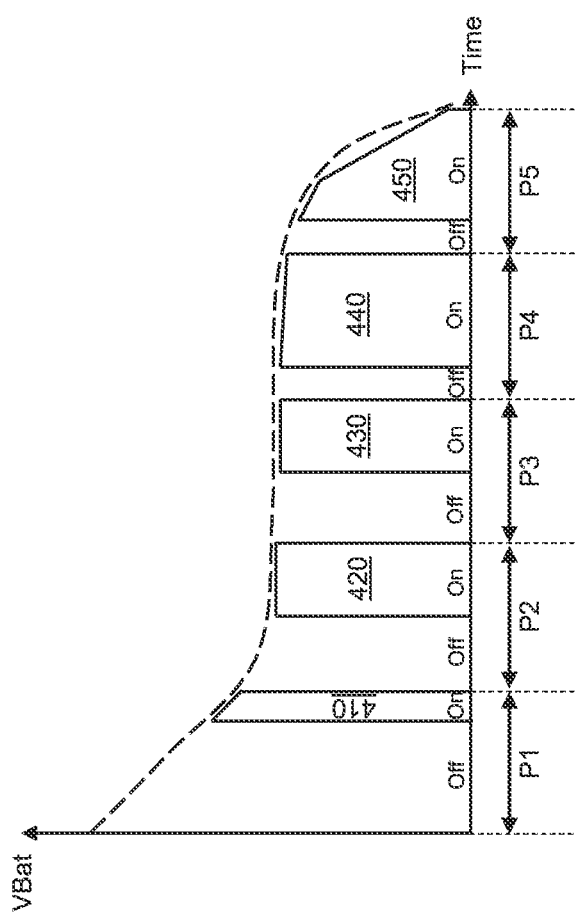
FIG. 4 is a graph illustrating a digital signal output by the circuitry of FIG. 3 over time.

This approach is illustrated in FIG. 4, which illustrates example digital, for example PWM, pulses 410-450 output by the PWM output driver circuitry 310 as the supply voltage VBat (shown in dashed line in FIG. 4) decreases over a plurality of PWM time periods P1-P5.

In contrast with the pulses 210-250 shown in FIG. 2, the pulses 410-450 are not of the same width (i.e. duration). Instead, the first pulse 410 of the first PWM period P1 is narrower (i.e. has a shorter duration) than the second and third pulses 430, 440 of the second and third PWM periods P2, P3. The fourth pulse 440 of the fourth PWM period P4 is slightly wider (has a slightly longer duration) than the second and third pulses 420, 430, and the fifth pulse 450 of the fifth PWM period is also wider (has a longer duration) than the second and third pulses 420, 430. (It is to be noted that the widths of the pulses are exaggerated in FIG. 4 for purposes of illustration, and thus the illustrative pulses 410-450 shown in FIG. 4 are not necessarily of equal area. However, as will be apparent from the following description, each of the pulses 410-450 represents the same average voltage per PWM period.)

The PWM output driver circuitry 310 thus controls or adjusts (relative to a default pulse width) the width of the pulses 410-450 to compensate for the changing supply voltage VBat, such that the average voltage supplied to the load 120 over each of the PWM periods P1-P5 is the same, in order to maintain a required load condition (e.g. a required motor speed, where the load 120 is a motor). Thus, for the first pulse 410 the pulse width has been reduced in comparison to the second and third pulses 420, 430, to compensate for its increased amplitude (height) relative to the second and third pulses 420, 430, whereas the pulse width of the fifth pulse 450 has been increased in comparison to the second and third pulses 420, 430, to compensate for its reduced amplitude (height) relative to the second and third pulses 420, 430. Thus the total area of each of the pulses 410-450 is the same.

Figure 5:
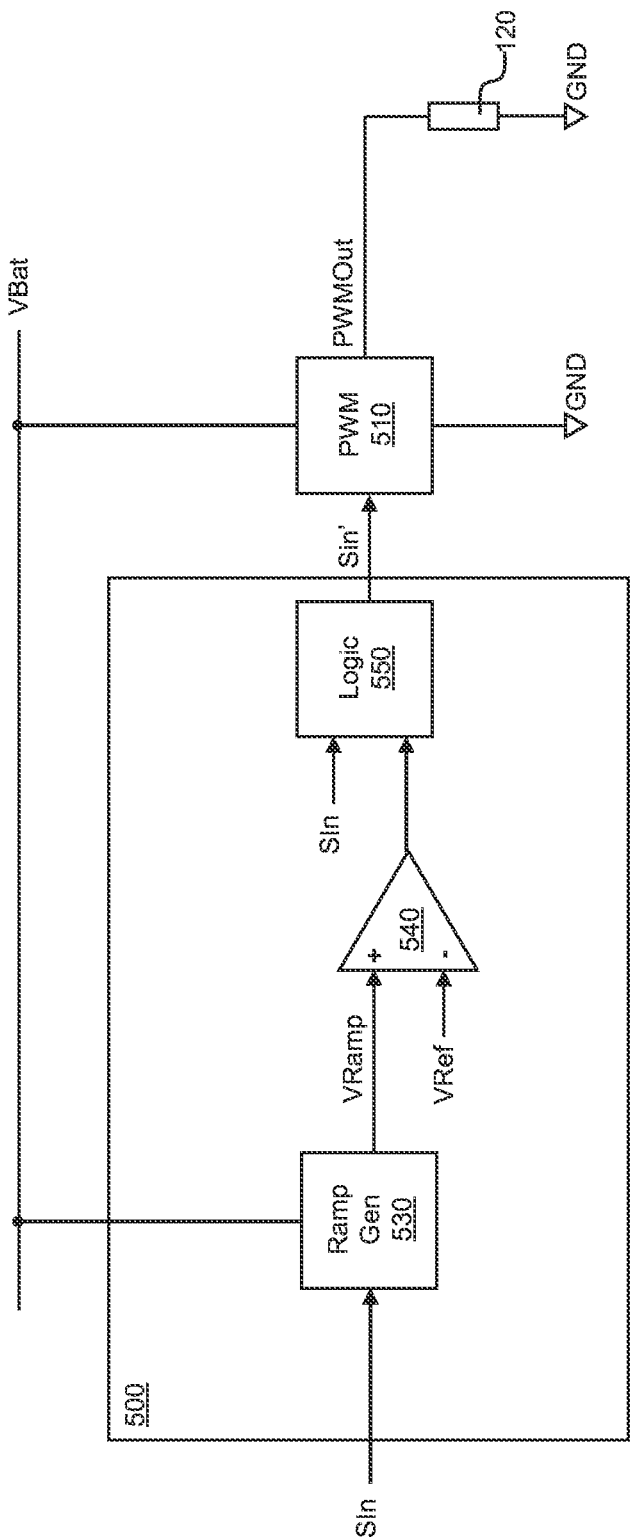
FIG. 5 is a schematic diagram illustrating example monitoring circuitry for use in the circuitry of FIG. 3.

FIG. 5 is a schematic representation of example circuitry implementing the monitoring circuitry 320. In the example illustrated in FIG. 5 the monitoring circuitry (shown generally at 500) is configured to generate a modified input signal SIn' and to output the modified input signal SIn' to digital, for example PWM, output driver circuitry 510 to control the operation of the digital output driver circuitry 510.

The PWM digital output driver circuitry 510 of FIG. 5 is the same as the digital PWM output driver circuitry 110 of FIG. 1a in construction and operation and thus will not be described in detail here.

The monitoring circuitry 500 comprises waveform generator circuitry 530 configured to receive the supply voltage VBat (e.g. from battery 130) and the input signal SIn and to generate, in this example, an increasing ramp voltage VRamp, the rate of increase of which is based on the amplitude of the voltage VBat. The ramp voltage VRamp is output to a first, non-inverting (+), input of comparator circuitry 540. A second, inverting (−), input of the comparator circuitry 540 receives a reference or threshold voltage VRef from a suitable reference voltage source.

An output of the comparator circuitry 540 is coupled to a first input of logic circuitry 550, which may comprise one or more flip-flops, logic gates or the like, as will be apparent to those of ordinary skill in the art. A second input of the logic circuitry 550 receives the input signal SIn. An output of the logic circuitry 550 is coupled to an input of the PWM output driver circuitry 510 to provide the modified input signal SIn' to the PWM output driver circuitry 510 to control the operation of the PWM output driver circuitry 510.

The operation of the monitoring circuitry 500 will now be described with reference to the timing diagram of FIGS. 6a and 6b.

Figure 6A:
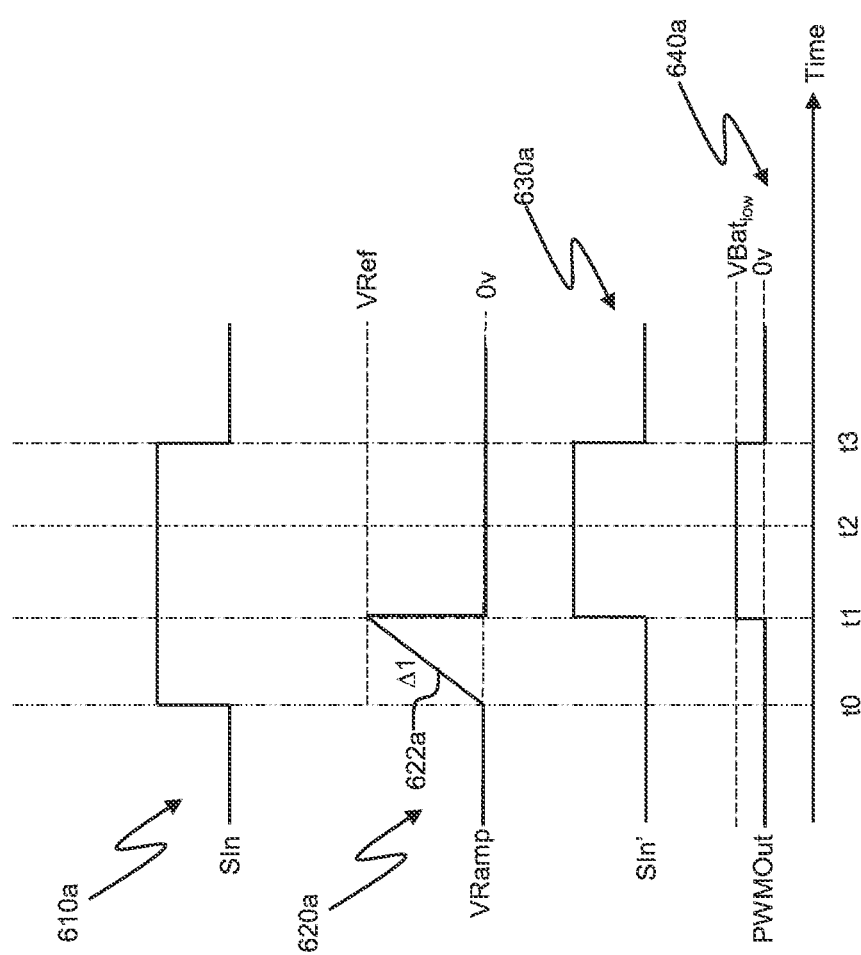

In FIG. 6a the uppermost trace 610a illustrates a single pulse of the input signal SIn, the second trace 620a illustrates the ramp voltage VRamp for relatively low supply voltage $VBat_{low}$, the third trace 630a illustrates the modified input signal SIn' for the relatively low supply voltage $VBat_{low}$ and the fourth trace 640a illustrates the PWM output signal PWMOut for the relatively low supply voltage $VBat_{low}$.

On detection of a rising edge of a pulse of the input signal SIn at time t0, the ramp generator circuitry 530 commences generating a ramp voltage that increases from 0 v. The rate of change Δ1, i.e. the slope 622a, of the ramp voltage is based on the supply voltage, such that for a relative high supply voltage $VBat_{high}$, the ramp voltage VRamp increases more slowly than for a relatively lower supply voltage $VBat_{low}$, i.e. the rate of increase of the ramp voltage VRamp is inversely proportional to the supply voltage VBat.

Where the supply voltage is relatively low (i.e. $VBat=VBat_{low}$), the ramp voltage VRamp reaches the reference voltage VRef at a time t1. Between t0 and t1 the ramp voltage VRamp is less than the reference voltage VRef and thus the output of the comparator circuitry 540 is low. The output of the logic circuitry 550 is thus also low, and so the modified input signal SIn' is low. The PWM output signal PWMOut is therefore low. The ramp voltage VRamp may be reset to 0 v when the reference voltage VRef is reached, or shortly thereafter.

At time t1 the ramp voltage VRamp reaches the reference voltage VRef and the output of the comparator circuitry 540 thus goes high, which in turn causes the output of the logic circuitry 550 to go high and the modified input signal SIn' also to go high. Thus the PWM output signal PWMOut is equal to (or close to) $VBat_{low}$.

At the end of the pulse of the input signal SIn (at time t3), the output of the logic circuitry 850 goes low, SIn' goes low and PWMOut goes low again.

In FIG. 6b the uppermost trace 610b illustrates a single pulse of the input signal SIn, the second trace 620b illustrates the ramp voltage VRamp for relatively high supply voltage $VBat_{high}$, the third trace 630b illustrates the modified input signal SIn' for the relatively high supply voltage VBat$_{high}$ and the fourth trace 640*b* illustrates the PWM output signal PWMOut for the relatively high supply voltage VBat$_{high}$.

Where the supply voltage is relatively high (i.e. VBat=VBat$_{high}$), the ramp voltage VRamp reaches the reference voltage VRef later than when the supply voltage is relatively low (i.e. VBat=VBat$_{low}$), at a time t2, i.e. the rate of change Δ2 (i.e. the slope 622*b*) of the voltage VRamp is less than when the supply voltage is relatively low. Between t0 and t2 the ramp voltage VRamp is less than the reference voltage VRef and thus the output of the comparator circuitry 540 is low. The output of the logic circuitry 550 is thus also low, and so the modified input signal SIn' is low. The PWM output signal PWMOut is therefore low.

At time t2 the ramp voltage VRamp reaches the reference voltage VRef and the output of the comparator circuitry 540 thus goes high, which in turn causes the output of the logic circuitry 550 to go high and the modified input signal SIn' also to go high. Thus the PWM output signal PWMOut is equal to (or close to) VBat$_{high}$. The ramp voltage VRamp may be reset to 0 v when the reference voltage VRef is reached, or shortly thereafter.

At the end of the pulse of the input signal SIn (at time t3), the output of the logic circuitry 550 goes low, SIn' also goes low and PWMOut goes low again.

On detection of the rising edge of the next pulse of the input signal SIn the ramp signal VRamp is at 0 v (or is reset to 0 v if it has not already been reset to 0 v) and again begins to increase, based on the magnitude of the supply voltage VBat.

As will be apparent in particular from traces 630*a*, 630*b*, 640*a*, 640*b*, the monitoring circuitry 500 compensates for a relatively lower supply voltage VBat$_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 500 compensates for a relatively higher supply voltage VBat$_{high}$ by reducing the width (i.e. duration) of a pulse in a PWM period of the output signal PWMOut, so as to maintain a substantially constant average voltage per PWM period, despite the increased magnitude of the supply voltage.

The monitoring circuitry 500 essentially implements timer circuitry which introduces a time offset, based on the magnitude of the supply voltage VBat, into a PWM signal generated by the PWM output driver circuitry 510. The introduced time offset compensates for a change in the magnitude of the supply voltage VBat by changing the length or duration of a PWM pulse.

While the operation of the monitoring circuitry 500 has been described above in terms of generation of a ramp voltage VRamp, it will be appreciated by those of ordinary skill in the art that the waveform generator circuitry 530 need not generate a linear ramp, but may instead generate some other waveform having an amplitude that changes over time, based on the supply voltage VBat.

Figure 7:
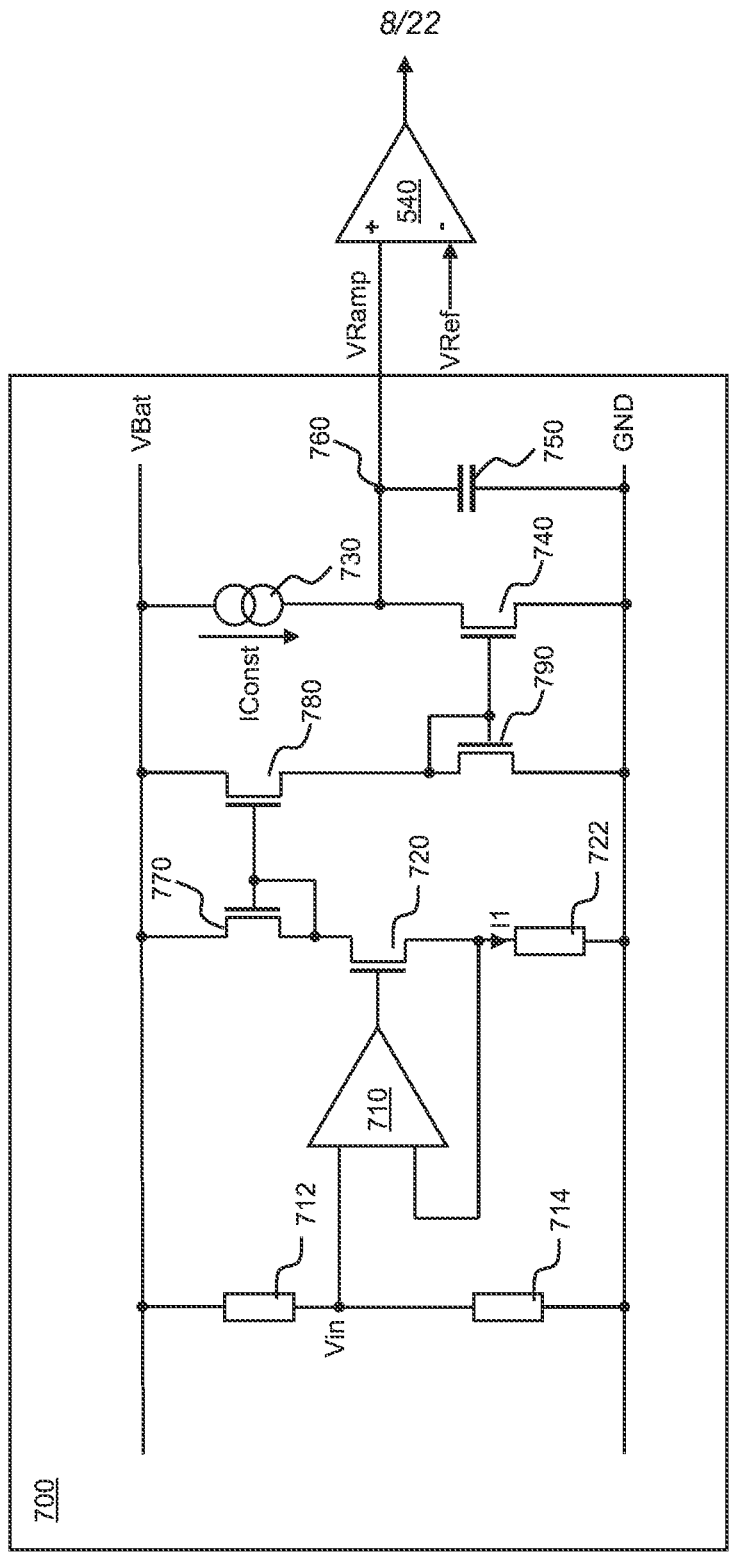
FIG. 7 is a schematic diagram illustrating example ramp generator circuitry.

FIG. 7 is a schematic representation of example circuitry implementing waveform generator circuitry 530 for the circuitry 500 of FIG. 5. In this example the circuitry comprises ramp generator circuitry.

The ramp generator circuitry, shown generally at 700 in FIG. 7, comprises amplifier circuitry 710 having a first input configured to receive a voltage Vin from a potential divider made up of first and second resistances 712, 714 coupled in series between a positive power supply voltage rail which receives the supply voltage VBat and a reference voltage supply rail GND which is coupled to ground or another suitable reference voltage. A second input of the amplifier circuitry receives a feedback signal from a feedback loop comprising a transistor 720 and a third resistance 722. Thus, as will be apparent to those of ordinary skill in the art, the amplifier circuitry 710 is configured to operate as a voltage to current converter to generate a voltage I1 that flows through the third resistance 722, where I1 is equal to Vin/R, where R is the resistance value of the third resistance 722.

The ramp generator circuitry 700 further comprises current generator circuitry 730, coupled in series with a second transistor 740 between the supply voltage rail and the reference voltage rail. A capacitor 750 is coupled in parallel with the transistor 740 between an output node 760 of the ramp generator circuitry 700 and the reference voltage supply rail GND.

The current I1 is mirrored to a control terminal (e.g. a gate terminal) of the second transistor 740 by current mirror transistors 770, 780, 790.

The second transistor 740 is operative to control the flow of a portion of the constant current IConst to the reference voltage supply rail GND. Thus, the second transistor 740 bleeds or diverts some of the current IConst that would otherwise flow to the capacitor 750, away from the capacitor 750, based on the current I1, which is proportional to the supply voltage VBat. Thus, as VBat increases, V1 increases and the current I1 also increases. This increase in I1 is mirrored to the control terminal of the second transistor 740, which therefore diverts more of the constant current IConst away from the capacitor 750, which reduces the rate of increase, i.e. slope, of the ramp voltage VRamp across the capacitor 750. In contrast, as VBat decreases, V1 decreases and the current I1 also decreases. The second transistor 740 diverts less of the constant current IConst away from the capacitor 750, thus increasing the rate of increase of the ramp voltage VRamp. Thus, the rate of increase of the ramp voltage VRamp is inversely proportional to the supply voltage VBat.

Figure 8:
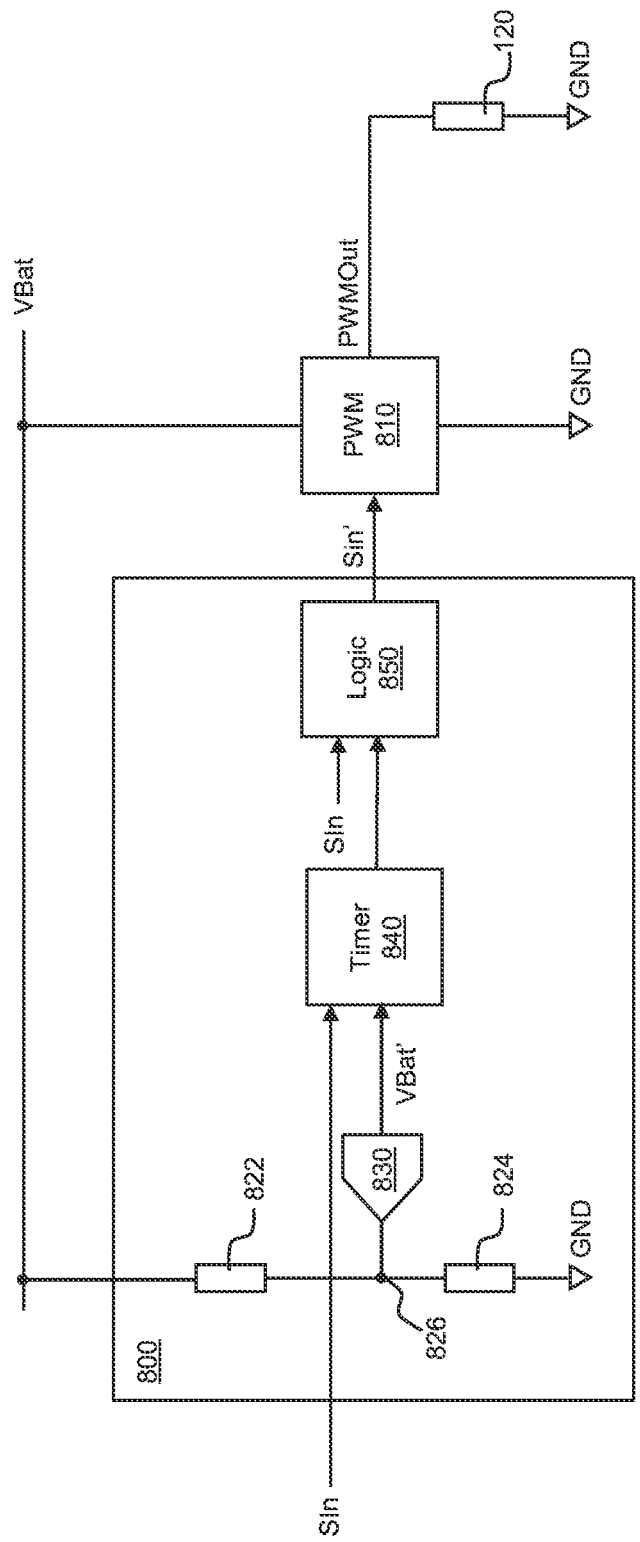
FIG. 8 is a schematic diagram illustrating alternative example monitoring circuitry.

FIG. 8 is a schematic representation of alternative example circuitry implementing the monitoring circuitry 320. In the example illustrated in FIG. 8 the monitoring circuitry (shown generally at 800) is configured to generate a modified input signal SIn' and to output the modified input signal SIn' to PWM output driver circuitry 810 to control the operation of the PWM output driver circuitry 810.

The PWM output driver circuitry 810 of FIG. 8 is the same as the PWM output driver circuitry 110 of FIG. 1 in construction and operation and thus will not be described in detail here.

The monitoring circuitry 800 comprises first and second resistances 822, 824 coupled in series between a positive supply rail which receives the supply voltage VBat and a reference supply voltage GND (or some other suitable reference voltage source) so as to form a voltage divider. A node 826 intermediate the first and second resistances 822, 824 is coupled to an input of analogue-to-digital converter (ADC) circuitry 830. The ADC circuitry 830 thus receives an input voltage indicative of the supply voltage VBat, and outputs a digital signal VBat' representative of the supply voltage VBat.

An output of the ADC circuitry 830 is coupled to a first input of timer circuitry 840, which therefore receives the digital signal VBat'. A second input of the timer circuitry 840 receives the input signal SIn.

An output of the timer circuitry 840 is coupled to a first input of logic circuitry 850. A second input of the logic circuitry receives the input signal SIn. The logic circuitry 850 may comprise one or more flip-flops, logic gates or the like, as will be apparent to those of ordinary skill in the art, and is configured to receive a signal output by the timer circuitry 840 and the input signal SIn and to generate a modified input signal SIn' to output to the PWM output driver circuitry 810.

In operation of the monitoring circuitry 800, the ADC circuitry 830 outputs the digital signal VBat' indicative of the magnitude of the supply voltage VBat to the timer circuitry 840. On detection of a rising edge of a pulse of the input signal SIn the timer circuitry 840 commences timing a time period of a fixed duration. The fixed duration is based on the digital signal VBat' output by the ADC circuitry 840, such that the fixed duration d of the time period is inversely proportional to the magnitude of the supply voltage. At the end of the time period, i.e. when the fixed duration has expired, the timer circuitry 840 outputs a signal to the logic circuitry 850, which starts an output pulse of the modified input signal SIn'. The output pulse of the modified input signal SIn' ends on detection by the logic circuitry 850 of the falling edge of the pulse of the input signal SIn.

The operation of the monitoring circuitry 1100 will now be described with reference to the timing diagrams of FIGS. 9a and 9b.

In FIG. 9a, the uppermost trace 910a illustrates a single pulse of the input signal SIn, the second trace 920a illustrates the operation of the timer circuitry 840 for relatively low supply voltage $VBat_{low}$, the third trace 930a illustrates the modified input signal SIn' for the relatively low supply voltage $VBat_{low}$ and the fourth trace 940a illustrates the PWM output signal PWMOut for the relatively low supply voltage $VBat_{low}$.

On detection of a rising edge of a pulse of the input signal SIn at time t0, the timer circuitry 840 starts timing the time period, which, as discussed above, has a fixed duration d1 that is determined based on the value of the digital signal output by the ADC circuitry 830, such that for a relatively low supply voltage $VBat_{low}$, the fixed duration d1 is shorter than the fixed duration d2 for a relatively higher supply voltage $VBat_{high}$. Thus, the fixed duration of the time period is inversely proportional to the magnitude of the supply voltage VBat.

Where the supply voltage is relatively low (i.e. $VBat=VBat_{low}$), the fixed duration d1 of the time period expires at a time t1, at which point the timer circuitry 840 stops timing and provides a trigger signal to the logic circuitry 850. Until this trigger signal is received by the logic circuitry 850, the output of the logic circuitry 850 is low, and so the modified input signal SIn' is low. The PWM output signal PWMOut is therefore low.

At time t1 the fixed duration d1 of the time period expires and the timer circuitry 840 outputs the trigger signal to the logic circuitry 850, which in turn causes the output of the logic circuitry 850 to go high and the modified input signal SIn' also to go high. Thus the PWM output signal PWMOut is equal to (or close to) $VBat_{low}$.

At the end of the pulse of the input signal SIn (at time t3), the output of the logic circuitry 850 goes low, SIn' goes low and PWMOut goes low again.

Figure 9B:
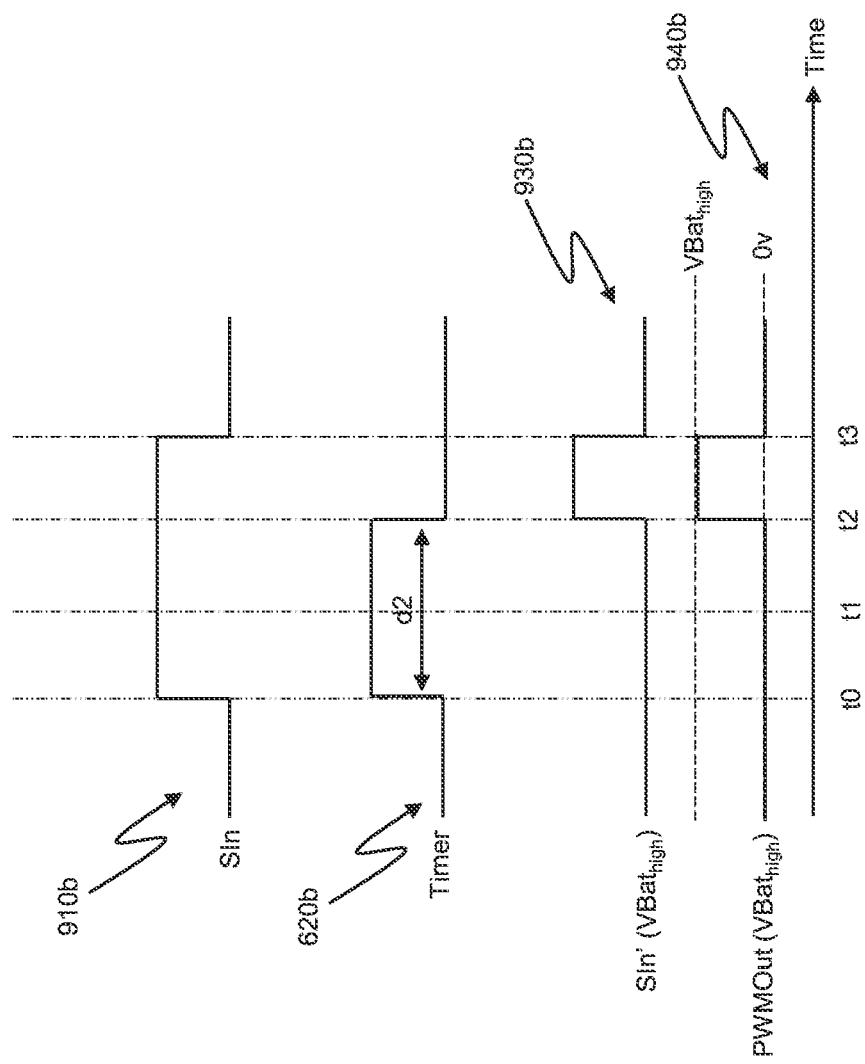

In FIG. 9b, the uppermost trace 910b illustrates a single pulse of the input signal SIn, the second trace 920b illustrates the operation of the timer circuitry 840 for relatively high supply voltage $VBat_{high}$, the third trace 930b illustrates the modified input signal SIn' for the relatively high supply voltage $VBat_{high}$ and the fourth trace 940b illustrates the PWM output signal PWMOut for the relatively high supply voltage $VBat_{high}$.

Where the supply voltage is relatively high (i.e. $VBat=VBat_{high}$), the fixed duration d2 of the time period of the timer circuitry 1140 expires later than when the supply voltage is relatively low (i.e. $VBat=VBat_{low}$), at a time t2, at which point the timer circuitry 840 outputs the trigger signal to the logic circuitry 850, Until the trigger signal is received, the output of the logic circuitry 850 is low, and so the modified input signal SIn' is low. The PWM output signal PWMOut is therefore low.

At time t2 the fixed duration d2 of the time period expires and the timer circuitry 840 outputs the trigger signal to the logic circuitry 850, which in turn causes the output of the logic circuitry 850 to go high and the modified input signal SIn' also to go high. Thus the PWM output signal PWMOut is equal to (or close to) $VBat_{high}$.

At the end of the pulse of the input signal SIn (at time t3), the output of the logic circuitry 850 goes low, SIn' also goes low and PWMOut goes low again.

On detection of the rising edge of the next pulse of the input signal SIn the timer circuitry 840 resets and begins timing a new time period, the fixed duration of which is based on the then-current magnitude of the supply voltage VBat.

As will be apparent in particular from traces 930a, 930b, 940a, 940b, the monitoring circuitry 800 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 800 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

Again, the monitoring circuitry 800 essentially implements timer circuitry which introduces a time offset, based on the magnitude of the supply voltage VBat, into a PWM signal generated by the PWM output driver circuitry 810. The introduced time offset compensates for a change in the magnitude of the supply voltage VBat by changing the length of a PWM pulse.

FIG. 10 is a schematic representation of further alternative example circuitry implementing the monitoring circuitry 320. In the example illustrated in FIG. 10 the monitoring circuitry (shown generally at 1000) is configured to generate a modified input signal SIn' and to output the modified input signal SIn' to PWM output driver circuitry 1010 to control the operation of the PWM output driver circuitry 1010.

The PWM output driver circuitry 1010 of FIG. 10 is the same as the PWM output driver circuitry 110 of FIG. 1 in construction and operation and thus will not be described in detail here.

The monitoring circuitry 1000 comprises voltage controlled oscillator (VCO) circuitry 1030 configured to receive the supply voltage VBat and to output an oscillating signal SOsc having a frequency fOsc which varies according to the magnitude of the supply voltage VBat. In this example the frequency fOsc of the oscillating signal SOsc is inversely proportional to the magnitude of the supply voltage VBat, such that when the supply voltage is relatively low (i.e. $VBat=VBat_{high}$), the fOsc is higher than when the supply voltage is relatively high (i.e. $VBat=VBat_{low}$).

An output of the VCO circuitry 1030 is coupled to a first input of counter circuitry 1040. A second input of the counter circuitry 1040 receives the input signal SIn. The counter circuitry 1040 is configured to commence a count of cycles of the oscillating signal SOsc received at its first input on detection of a rising edge of a pulse of the input signal SIn, and to output a trigger signal to the logic circuitry 1050 when the value Cnt of the count reaches a count value CntVBat that represents the supply voltage VBat. As will be appreciated, the count value CntVBat that represents the supply voltage VBat will be reached more quickly at higher values of fOsc than at lower values of fOsc, and thus the count value CntVBat that represents the supply voltage VBat will be reached more quickly when the magnitude of the supply voltage VBat is lower.

An output of the counter circuitry 1040 is coupled to a first input of logic circuitry 1050. A second input of the logic circuitry 1050 receives the input signal SIn. The logic circuitry 1050 may comprise one or more flip-flops, logic gates or the like, as will be apparent to those of ordinary skill in the art, and is configured to receive a trigger signal output by the counter circuitry 1040 and the input signal SIn and to generate a modified input signal SIn' to output to the PWM output driver circuitry 1010.

In operation of the monitoring circuitry 1000, the VCO circuitry 1030 outputs the oscillating signal SOsc, whose frequency fOsc is based on or indicative of the magnitude of the supply voltage VBat to the counter circuitry 1040. On detection of a rising edge of a pulse of the input signal SIn the counter circuitry 1040 commences counting oscillations of the oscillating signal SOsc until the count value CntVBat that represents the supply voltage VBat is reached, at which point the counter circuitry 1040 outputs the trigger signal to the logic circuitry 1050, which starts an output pulse of the modified input signal SIn'. The output pulse of the modified input signal SIn' ends on detection by the logic circuitry 1050 of the falling edge of the pulse of the input signal SIn.

The operation of the monitoring circuitry 1000 will now be described with reference to the timing diagrams of FIGS. 11*a* and 11*b*.

Figure 11A:
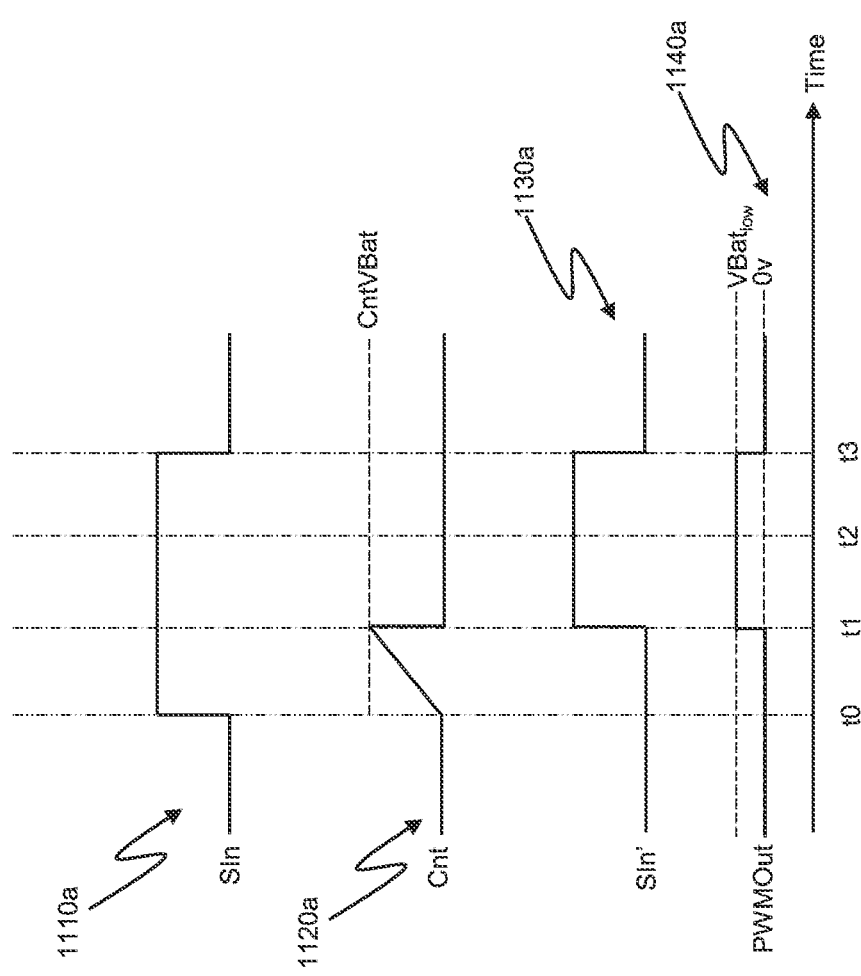
FIGS. 11a and 11b are timing diagrams illustrating the operation of the circuitry of FIG. 10.

In FIG. 11*a* the uppermost trace 1110*a* illustrates a single pulse of the input signal SIn, the second trace 1120*a* illustrates the count value Cnt for a relatively low supply voltage $VBat_{low}$, the third trace 1130*a* illustrates the modified input signal SIn' for the relatively low supply voltage $VBat_{low}$, the fourth trace 1140*a* the PWM output signal PWMOut for the relatively low supply voltage $VBat_{low}$.

On detection of a rising edge of a pulse of the input signal SIn at time t0, the counter circuitry 1040 starts counting cycles of the oscillating signal SOsc output by the VCO circuitry 1030. As discussed above, the frequency fOsc of the oscillating signal SOsc is based on the magnitude of the supply voltage VBat, such that for a relatively low supply voltage $VBat_{high}$, the frequency fOsc is higher than for a relatively higher supply voltage $VBat_{low}$.

Where the supply voltage is relatively low (i.e. $VBat=VBat_{low}$), the count value CntVBat that represents a magnitude of the supply voltage VBat is reached at a time t1, at which point the counter circuitry 1040 outputs the trigger signal to the logic circuitry 1050. The output of the logic circuitry 1050 is thus low until t1, and so the modified input signal SIn' is also low. The PWM output signal PWMOut is therefore low.

At time t1 the count value CntVBat that represents the magnitude of the supply voltage VBat is reached and counter circuitry 1040 outputs the trigger signal to the logic circuitry 1050, which in turn causes the output of the logic circuitry 1050 to go high and the modified input signal SIn' also to go high. Thus the PWM output signal PWMOut is equal to (or close to) $VBat_{low}$.

At the end of the pulse of the input signal SIn (at time t3), the output of the logic circuitry 1050 goes low, SIn' goes low and PWMOut goes low again. The count value Cnt may be reset to zero at an appropriate point, e.g. when it reaches CntVBat (or shortly thereafter), at the end of the pulse of the input signal SIn.

Figure 11B:
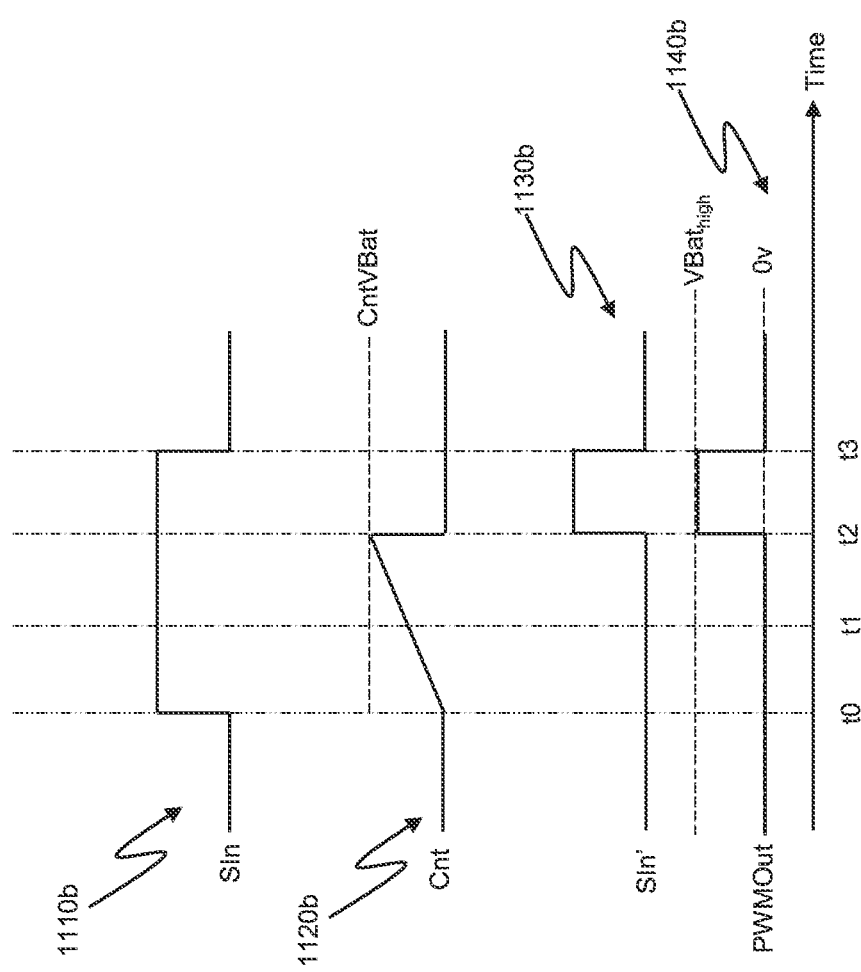

In FIG. 11*b* the uppermost trace 1110*b* illustrates a single pulse of the input signal SIn, the second trace 1120*b* illustrates the count value Cnt of the counter circuitry 1040 for a relatively high supply voltage $VBat_{high}$, the third trace 1130*b* illustrates the modified input signal SIn' for the relatively high supply voltage $VBat_{high}$, and the fourth trace 1140*b* illustrates the PWM output signal PWMOut for the relatively high supply voltage $VBat_{high}$.

Where the supply voltage is relatively high (i.e. $VBat=VBat_{high}$), the count value CntVBat that represents the magnitude of the supply voltage VBat is reached later than when the supply voltage is relatively low (i.e. $VBat=VBat_{low}$), at a time t2, at which point the counter circuitry 1040 outputs the trigger signal to the logic circuitry 1050. The output of the logic circuitry 1050 is thus low until t2, and so the modified input signal SIn' is also low. The PWM output signal PWMOut is therefore low.

At time t2 the count value CntVBat that represents the magnitude of the supply voltage VBat is reached and the counter circuitry 1040 outputs the trigger signal to the logic circuitry 1050, which in turn causes the output of the logic circuitry 1050 to go high and the modified input signal SIn' also to go high. Thus the PWM output signal PWMOut is equal to (or close to) $VBat_{high}$.

At the end of the pulse of the input signal SIn (at time t3), the output of the logic circuitry 1050 goes low, SIn' also goes low and PWMOut is also low. The count value Cnt may be reset to zero at an appropriate point, e.g. when it reaches CntVBat (or shortly thereafter), at the end of the pulse of the input signal SIn.

On detection of the rising edge of the next pulse of the input signal SIn the counter circuitry 1040 resets (if it has not previously been reset) and begins counting oscillations of the signal SOsc, whose frequency fOsc which is based on the then-current magnitude of the supply voltage VBat.

As will be apparent in particular from traces 1130*a*, 1130*b*, 1140*a*, 1140*b*, the monitoring circuitry 1000 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 1000 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

Again, the monitoring circuitry 1000 essentially implements timer circuitry which introduces a time offset, based on the magnitude of the supply voltage VBat, into a PWM signal generated by the PWM output driver circuitry 1010. The introduced time offset compensates for a change in the magnitude of the supply voltage VBat by increasing the length of a PWM pulse.

The circuitry 300 may be incorporated in a host device, which may be a battery powered device. For example, the host device may comprise a computer game controller, a virtual reality (VR) or augmented reality (AR) device such as a headset, eyewear or the like, a mobile telephone, a tablet or laptop computer or an accessory device such as headphones, earphones or a headset.

FIG. 12 is a schematic representation showing some elements of such a host device. The host device, shown generally at 1200 in FIG. 12, includes a battery 1210, a load 120, which may be, for example, an output transducer such as a motor, LED or LED array, a haptic transducer, a resonant actuator or a servo, or may alternatively be electronic circuitry such as amplifier circuitry. The load 120 is controlled by the PWM output driver circuitry 310 based on a modified input signal SIn' output by monitoring circuitry 320, as described above with reference to FIGS. 3-11.

The host device 1200 may further comprise one or more input transducers 1220 (and associated driver circuitry), which may comprise, for example, a microphone, a joystick, one or more buttons, switches, force sensors, touch sensors and/or touch screens, and one or more output transducers 1230 (and associated driver circuitry), which may comprise, for example, one or more haptic output transducers, one or more audio output transducers such as loudspeakers and one or more video output transducers such as screens, displays or the like.

Figure 13A:
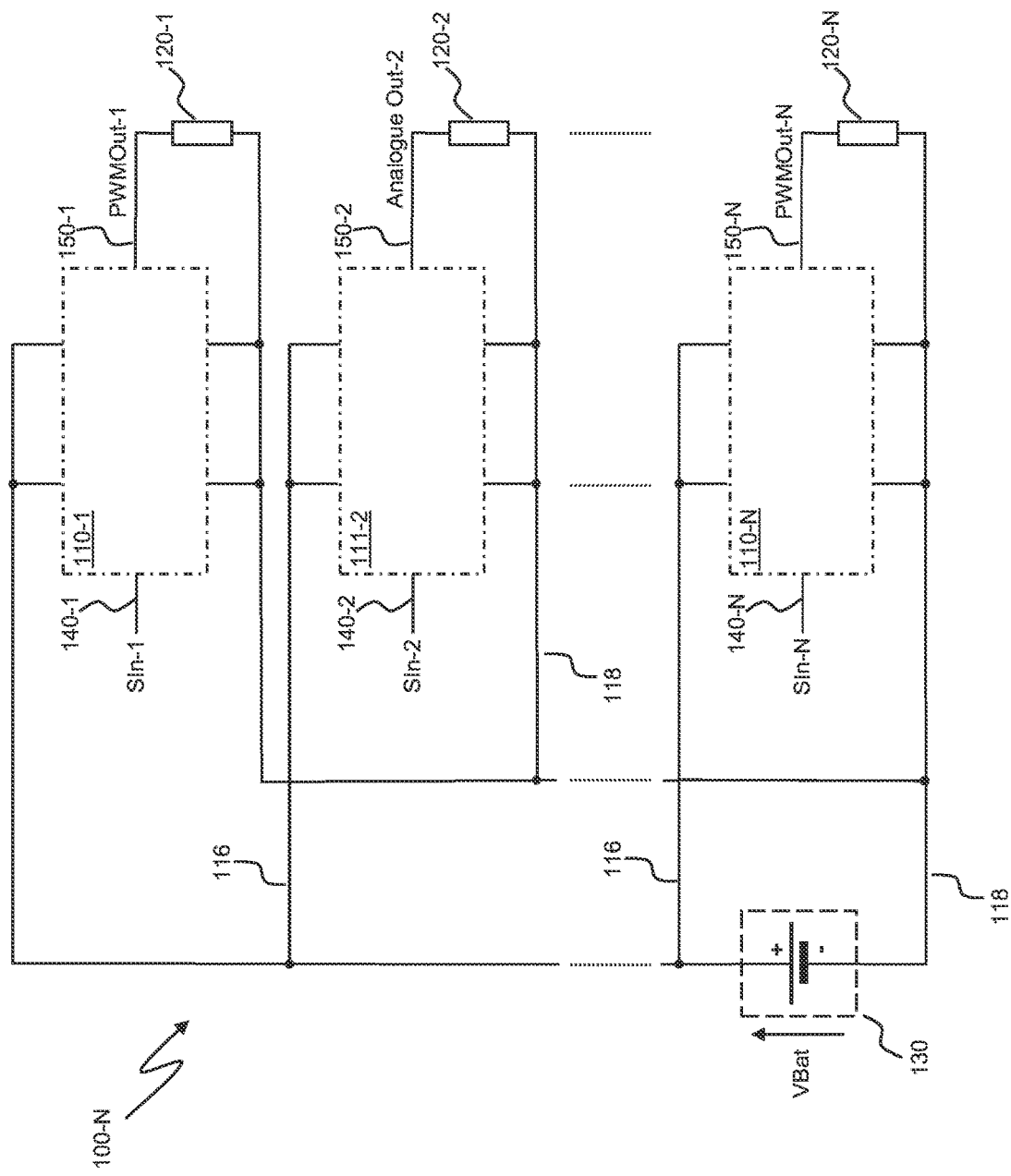
FIG. 13a is a schematic diagram illustrating circuitry for driving a plurality of transducers using a respective plurality of digital signals.

FIG. 13*a* is a variation on FIGS. 1*a* and 1*b* wherein a plurality (N) of digital and/or analogue output driver circuits 110-1-to-110-N are coupled to respective loads 120-1-to-120-N. Each of the loads 120-1-to-120-N may be, for example, a transducer such as a: motor; LED (or LED array); a servo; a speaker, a haptic transducer; a resonant actuator or the like including various combinations thereof. Alternatively, and/or additionally, one or more of the loads 120-1-to-120-N may be, for example, electronic circuitry such as an audio amplifier, for example.

Each of the digital and/or analogue output driver circuits 110-1-to-110-N receives a supply voltage VBat from a power supply, which in this example is a battery 130, but which could equally be a power supply or a power converter, regulator or the like whose output voltage can vary due to transient loads from other components or systems of a host device incorporating the circuitry 100/100-N. For the purposes of brevity, references to digital output driver circuits 110-1-to-110-N also includes references to analogue output driver circuits 111-1-to-111-N, see FIG. 1*b*, and any and all combinations of digital and/or analogue PWM output driver circuits.

Each of the digital and/or analogue output driver circuits 110-1-to-110-N comprises the same or similar circuitry as illustrated in FIGS. 1*a* and 1*b* and each receives a respective input signal SIn-1-to-SIn-N to drive a respective load 120-1-to-120-N.

To maintain a constant average voltage per respective PWM period PWMOut-1-to-PWMOut-N (and thus to maintain a consistent output to a respective load 120-1-to-120-N, e.g. a consistent motor speed, in the case where a load 120 is a DC motor, or to maintain a consistent light intensity, in the case where the load 120 is an LED or an LED array), each respective PWM output driver circuit 110-1-to-110-N generates a respective PWM output signal PWMOut-1-to-PWMOut-N with a respective constant duty cycle or mark-to-space ratio. This approach is effective when the supply voltage VBat remains constant. However, if the supply voltage VBat changes, e.g. decreases as a result of discharge of the battery 130 over time and/or as a result of other components, systems, transients or circuitry of the host device drawing current from the battery 130, the average voltage of the respective PWM output signals PWMOut-1-to-PWMOut-N over respective PWM signal periods also falls, as will be explained below with reference to FIGS. 14*a* and 14*b*.

Figure 13B:
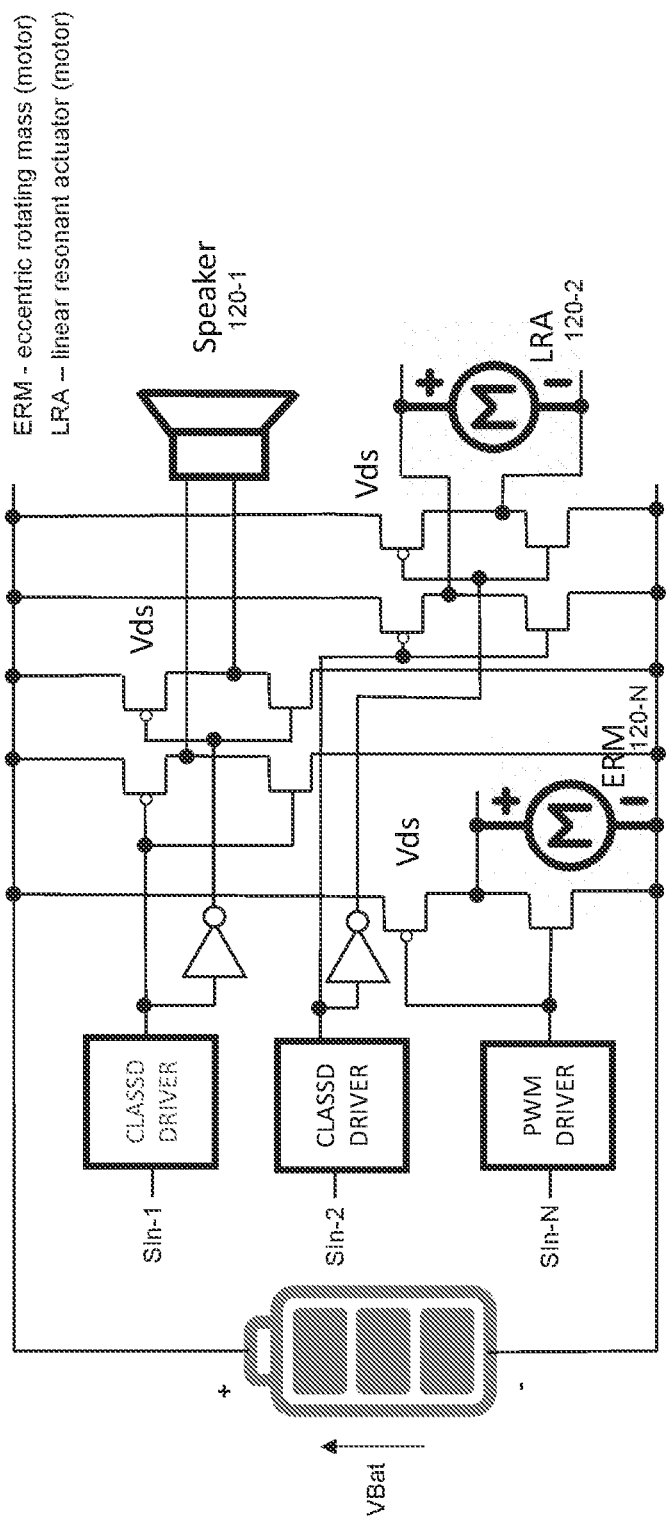
FIG. 13b is a schematic diagram illustrating circuitry for driving a plurality of transducers using a respective plurality of digital signals.

FIG. 13*b* is a variation on FIG. 13*a* wherein a plurality (N) of digital output driver circuits 110-1-to-110-N are coupled to respective loads 120-1-to-120-N. Each of the loads 120-1-to-120-N may be, for example, as those described with respect to FIG. 13*a*. All other relevant aspects between FIGS. 13*a* and 13*b* are as described above in respect of FIG. 13*a*, as will be understood by those of ordinary skill in the art.

Figure 14:
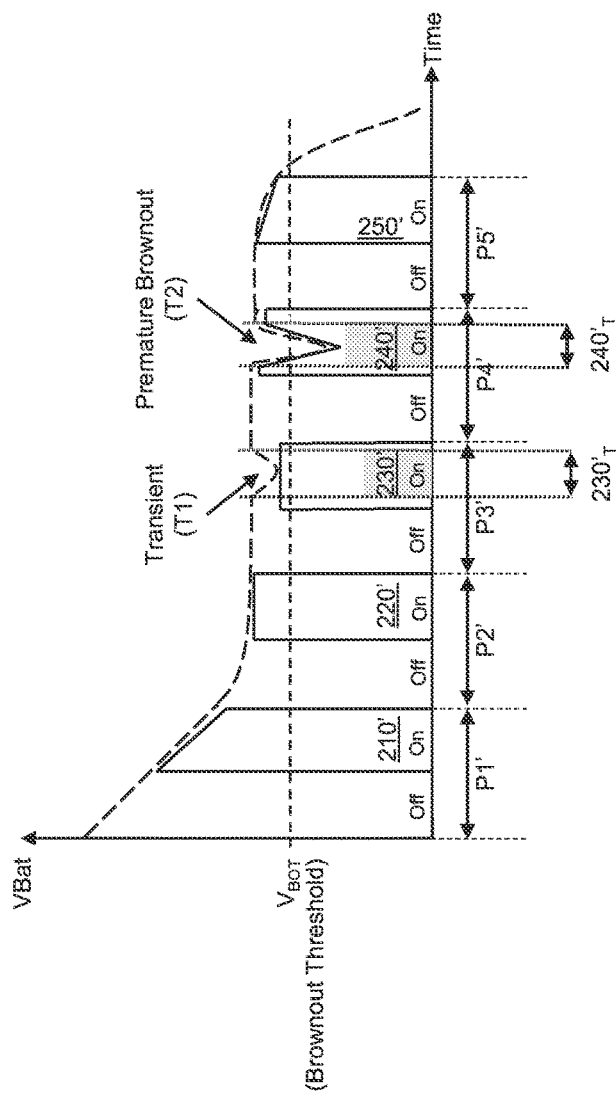
FIG. 14 is a graph illustrating a digital signal output by the circuitry of FIGS. 13a or 13b over time.

FIG. 14 illustrates example digital pulses 210'-250' output by, for the most part, just one of the plurality of digital output driver circuits 110-1-to-110-N as the supply voltage VBat (shown in the upper dashed line in FIG. 2*b*) decreases over a plurality of PWM time periods P1'-P5'.

For the purposes of clarity in the explanation of this FIG. 14, only PWM output driver circuit 110-1 will be described, for the most part, and it will be understood by those of ordinary skill in the art that the same principles apply to any and all other output driver circuits 110-2-to-110-N.

It is to be understood that FIG. 14 is a highly simplified representation of the PWM pulses 210'-250', and is for illustrative purposes only. As will be appreciated by those of ordinary skill in the art, in a real application the frequency of a PWM signal will be very much higher, e.g. of the order of kilohertz or megahertz.

As will be appreciated by those of ordinary skill in the art, the average voltage (or, equivalently, the average power) supplied by the PWM output driver circuitry 110-1 to its load 120-1 during a first PWM period P1' is represented by the area of the pulse 210'.

Similarly, the average voltage supplied by the modulator circuitry 110-1 to its load 120-1 during each of the PWM periods P2'-P5' is represented by the area of the pulses 220'-250' respectively.

If the supply voltage VBat were constant then the average voltage supplied to the load 120-1 by the PWM output driver circuitry 110-1 during each of the PWM periods P1'-P5' would be the same, so the pulses 210'-250' would all have the same area. However, in the illustrated example the supply voltage VBat decreases over time, and thus although the width of each of the pulses 210'-250' (i.e. the on-time in each PWM period) is the same, the pulses 210'-250' are not all of the same voltage magnitude (i.e. are not all of the same amplitude or height), and so the average voltage and therefore power supplied to the load 120-1 per PWM period is not constant. This leads to inconsistency in the output signal PWMOut-1 that drives the load 120-1, which leads to, for example, an inconsistent motor speed in the case where the transducer 120-1 is a DC motor, or an inconsistent light intensity in the case where the load 120-1 is an LED or an LED array.

As illustrated in FIG. 14, there are two examples of the occurrence of transient events T1 and T2. These transients may occur as a result of an over-current demand from any combination of the loads 120-2-to-120-N and/or any combination of other components or systems of a host device with that of the load demands of PWM output driver circuitry 110-1 and to its load 120-1. The greyed-out sections within the PWM "On" pulses 230' and 240' represent PWM 'On' pulses, respectively 230'$_T$ and 240'$_T$, from any combination of the loads 120-2-to-120-N and/or any combination of other components or systems of a host device that happen to coincide with the PWM 'On' periods 230' and 240' of PWM output driver circuitry 110-1 and its load 120-1. This coincidence of PWM 'On' periods illustrates how such transients T1 and T2 may occur when two or more of the PWM 'On' pulses of any combination of the loads 120-1-to-120-N and/or any combination of other components or systems of a host device coincide, whether wholly and/or partially, and exceed the current delivery capabilities of the supply voltage, VBat. As will be appreciated by those of ordinary skill in the art, a real-life application would result in a far more complex situation than illustrated in FIG. 14.

As can be seen in FIG. 14, the transient T1 causes the supply voltage VBat to decrease due to an over-current demand during the P3' PWM period due to the coincidence of a plurality of PWM 'On' pulses that exceed the current delivery capabilities of the supply voltage, VBat. However, the over-current demand is not enough to decrease the supply voltage VBat to below the brownout threshold $V_{BOT}$ and the supply voltage VBat returns to its notional level when the over-current demand ceases, i.e. when the coincidence of a plurality of PWM 'On' pulses ceases.

Similarly, transient T2 causes the supply voltage VBat to decrease due to an over-current demand during the P4' PWM period due to the coincidence of a plurality of PWM 'On' pulses that exceed the current delivery capabilities of the supply voltage, VBat. In this T2 scenario however, the over-current demand is more than enough to decrease the supply voltage VBat to below the brownout threshold $V_{BOT}$ before the supply voltage VBat returns to its notional level when the over-current demand ceases, i.e. when the coincidence of a plurality of PWM 'On' pulses ceases. However, when the supply voltage VBat goes below the brownout threshold $V_{BOT}$ this triggers the PWM output driver circuits 110-1-to-110-N and/or other components or systems of a host device incorporating the PWM output driver circuits 110-1-to-110-N to, for example, power down and either reset or turn off completely.

The coincidence of PWM 'On' periods, whether it results in triggering a brownout condition or not may also cause thermal issues that may result in the PWM output driver circuits 110-1-to-110-N and/or other components or systems of a host device incorporating the PWM output driver circuits 110-1-to-110-N to, for example, power down and either reset or turn off completely.

Figure 15A:
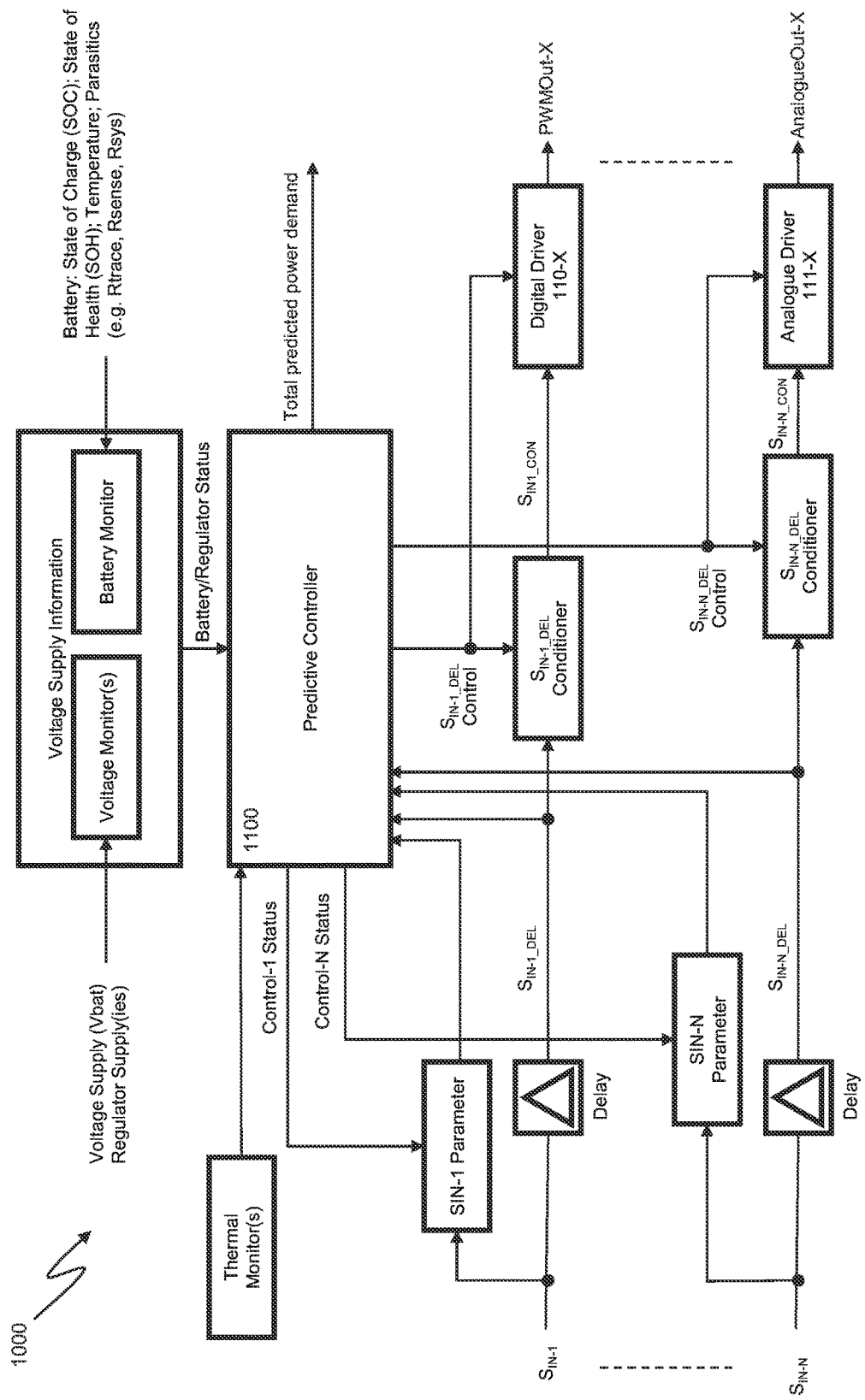
FIG. 15a is a schematic block diagram illustrating monitoring and control elements.

FIG. 15a is a block level representation of elements, such as hardware and/or firmware and/or software for example, for monitoring and controlling aspects of the digital and/or analogue output driver circuits 110/1-1-to-110/1-N, including their respective signal paths and/or associated blocks and/or other components or systems of a host device incorporating the digital and/or analogue output driver circuits 110/1-1-to-110/1-N (not all of which may be illustrated for reasons of clarity of explanation). Hereon in, only digital output driver circuits 110-1-to-110-N will be described for reasons of brevity and clarity but the same or similar reasoning will be applicable to analogue output driver circuits 111-1-to-111-N as will be appreciated and understood by those of ordinary skill in the art.

Each of the PWM output driver circuits 110-1-to-110-N drive respective loads 120-1-to-120-N (not illustrated) using respective PWM output signals 120-1-to-120-N. One or more parameters of the one or more of the respective digital pulses of the PWM output signals, such as pulse width or pulse amplitude for example, may be conditioned, controlled or adjusted, using a predictive controller 1100 for example, to compensate for "changes" in, for example, the supply voltage VBat and/or regulator supply(ies) and/or battery parameters including, but not limited to, its state of charge (SOC), state of health, temperature, and/or parasitic elements (e.g. Rtrace, Rsense, Rsystem), and/or temperature of hardware, firmware and/or other components or systems of a host device incorporating, at least, the hardware and/or firmware and/or software illustrated in the block level representation of FIG. 15a.

The high-level concept illustrated in FIG. 15a is to use knowledge of when and where transient loads and/or their associated effects occur, or are likely to occur, so as to compensate for the aforementioned "changes" and predictively condition, control or adjust one or more parameters of the one or more of the respective PWM pulses.

The predictive controller 1100 may for example be a state machine that predictively conditions, controls or adjusts one or more parameters of the one or more of the respective PWM pulses PWMOut-1-to-PWMOut-N to compensate for "changes" in, for example, the battery/regulator status, thermal information from one or more thermal monitors and/or any combination of the signals SIN-1-to-SIN-N at any point in the signal path and/or their respective signal parameters. Additionally, the predictive controller 1100 may for example, based on one or more of its various inputs, output a 'total predicted power demand signal, or the like, that may be sent to a battery charger controller (not illustrated), or part thereof, such as a battery charger state machine, so as to allow the battery charger controller to dynamically stop or reduce the battery charge current so as to avoid over temperature or over current events.

The approach illustrated in FIG. 15a, therefore, at a high conceptual level, uses knowledge of and/or associated with the system and/or transient loads, as well as the current supply voltage level, to control one or more parameters of the digital signal, for example the width of the PWM signals, accordingly so as to at least mitigate, or preferably prevent, brownout that would normally occur at T2, for example, and/or reduce peak thermal issues that may occur in the system and/or provide consistent drive strength or provide a consistent output power, i.e. drive pulse area.

A host device typically includes one or more processors which control, for example, the transducers and associated power regulators and controllers, including a battery charger controller. The control and/or data signals from the one or more processors and/or controllers may also be observed by a controller 1100 before they are applied to the transducer output. This signal lookahead may also provide an opportunity to compensate for any reduction in supply voltage VBat that may arise from the transducer(s) or power regulator(s) to either mitigate or avoid a brownout condition by reducing the transducer output power or to provide a consistent output level by adapting the output level to the supply level. Additionally, or alternatively, the cumulative demand can be reduced to lower thermal heating particularly through on-chip I2R losses such as in the transducer drivers or regulators for example.

The power predictions of each transducer input signal PWMOut-X, Analogue-X (where X represents a number between 1 and N) could be based on one or more parameters such as, for example: the amplitude level of its respective input signal $S_{IN-1}$-to-$S_{IN-N}$; known optionally programmable load characteristics; complex properties such as, but not limited to, the transient gradient, e.g. for estimation of inrush current; frequency; average power; and/or transducer efficiency.

Voltage supply information may include for example: voltage monitors to measure the current battery (and where required) regulator supply levels; and/or impedance monitors to measure or estimate battery impedance based on some or all of the battery characteristics such as, for example: state-of-charge; state-of-health; current temperature; parasitic elements such as battery PCB/connector trace impedance, current sense resistance and/or battery resistance.

The predictive signal controller 1100 may consider the cumulative effect of each of the transducer inputs' power predictions (or a selectable subset thereof) and combined with the current voltage supply levels and prediction of battery impedance, predictively condition, control or adjust transducer signals before application to their transducer outputs (or condition, control or adjust the transducer driver or regulator) if required to either avoid premature battery brownout and/or reduce peak thermal issues and/or provide a consistent transducer power output level, i.e. drive strength, in the presence of a varying supply voltage. Whether all transducers or a subset thereof are adjusted is optional.

Additionally, and/or alternatively, the predictive signal controller 1100 may provide respective signal adjustment status to the respective individual power predictors to allow them to dynamically compensate their estimates. The predictive controller 1100 may also consider the properties of the pre-adjusted but delayed respective transducer input signals $S_{IN\text{-}1\_DEL}$-to-$S_{IN\text{-}N\_DEL}$ to ensure a large power demand has passed or may match the delay of the respective power prediction to its signal path delay.

The application of any signal adjustment may be applied to the signal directly and/or to the transducer's DAC/driver (such as when used to modulate the PWM drive signal similar to the schemes outlined in co-pending U.S. patent application No. 63/059,504).

The long-term supply voltage VBat measurement could be a short-term estimation or may optionally be filtered, delayed or averaged to account for effects such as, for example, decoupling capacitance. Transducer signal monitoring may include programmability for transducer properties such as, for example, peak output power, ageing effects etc. VBat estimation may include, for example, programmability for inclusion of decoupling capacitors which may provide short-term charge demand before the battery charge is required, this can allow an optimization by not overly reducing the signal if not required. The predictive controller 1100 may also receive temperature information from one or more thermal monitors—this information can be used along with the cumulative effect of each of the transducer inputs' power predictions and battery status to reduce the transducer driver or regulator power consumption. The temperature measurement(s) could be instantaneous or averaged over a programmable period of time and considered with programmable hysteretic thresholds.

Figure 15B:
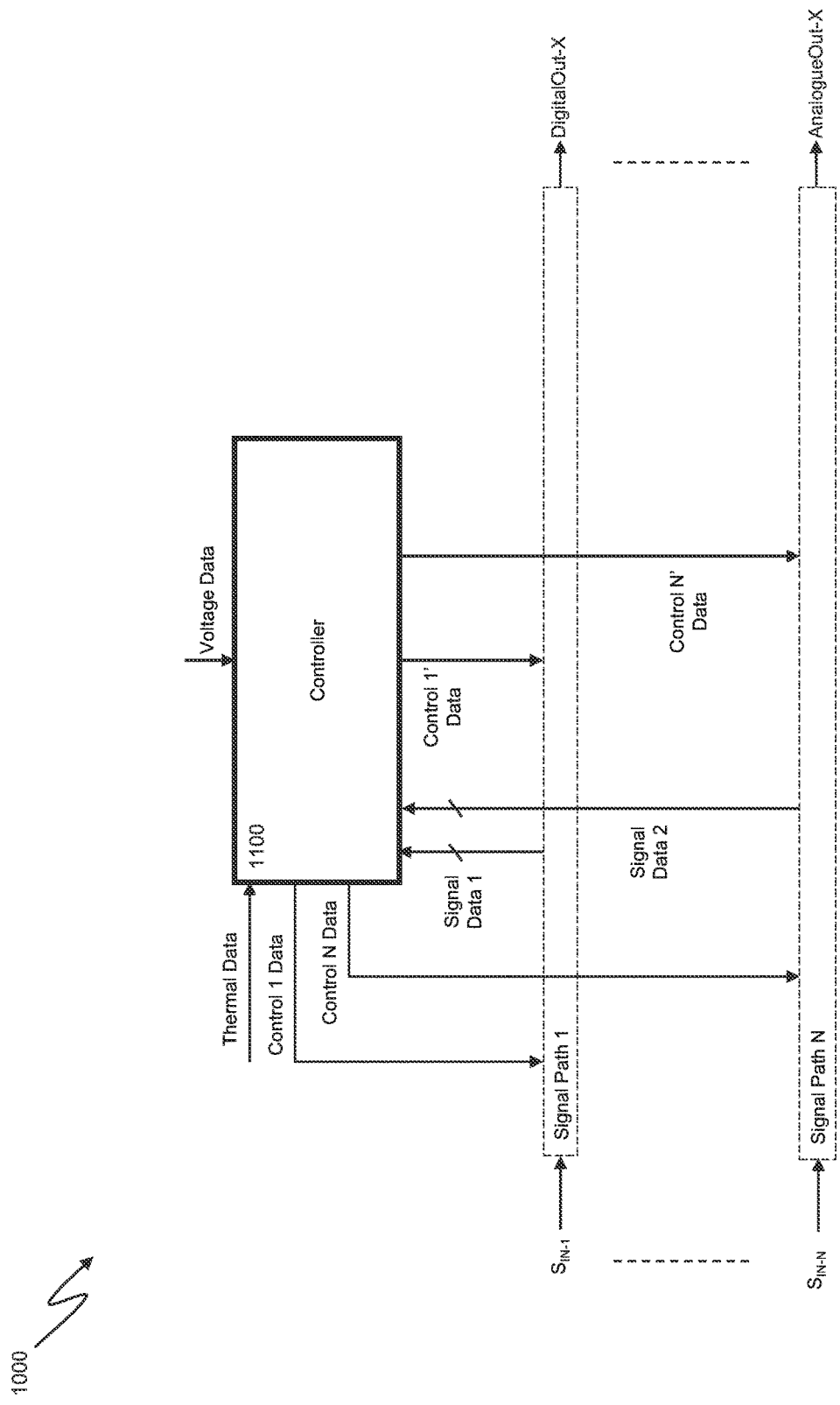
FIG. 15b is a simplified schematic block diagram illustrating monitoring and control elements.

FIG. 15b is a simplified block level representation of elements, such as hardware and/or firmware and/or software for example, for monitoring and controlling aspects of the digital and/or analogue output signals that are used to drive respective loads (not illustrated), including their respective signal paths and/or associated blocks and/or other components or systems of a host device incorporating the digital and/or analogue output driver circuits (not all of which may be illustrated for reasons of clarity of explanation). FIG. 15b illustrates circuitry receiving a voltage derived from a voltage supply, such as a battery for example, for controlling one or more signal paths, the circuitry comprises a controller configured to receive voltage data and/or thermal data and/or signal data from said one or more signal paths wherein each path comprises a respective transducer driver. The controller is also configured to output control data to one or more of the signal paths for controlling one or more characteristics of respective signals in the one or more respective signal paths. The controller is preferably a predictive controller, i.e. a lookahead controller, for controlling, based on one or more aspects of the received voltage and/or thermal and/or signal data, one or more characteristics of the respective signals in the one or more respective signal paths before these signals are output from their respective transducer drivers so as to mitigate or avoid an adverse voltage and/or thermal and/or signal condition relating to at least said circuitry.

Figure 16:
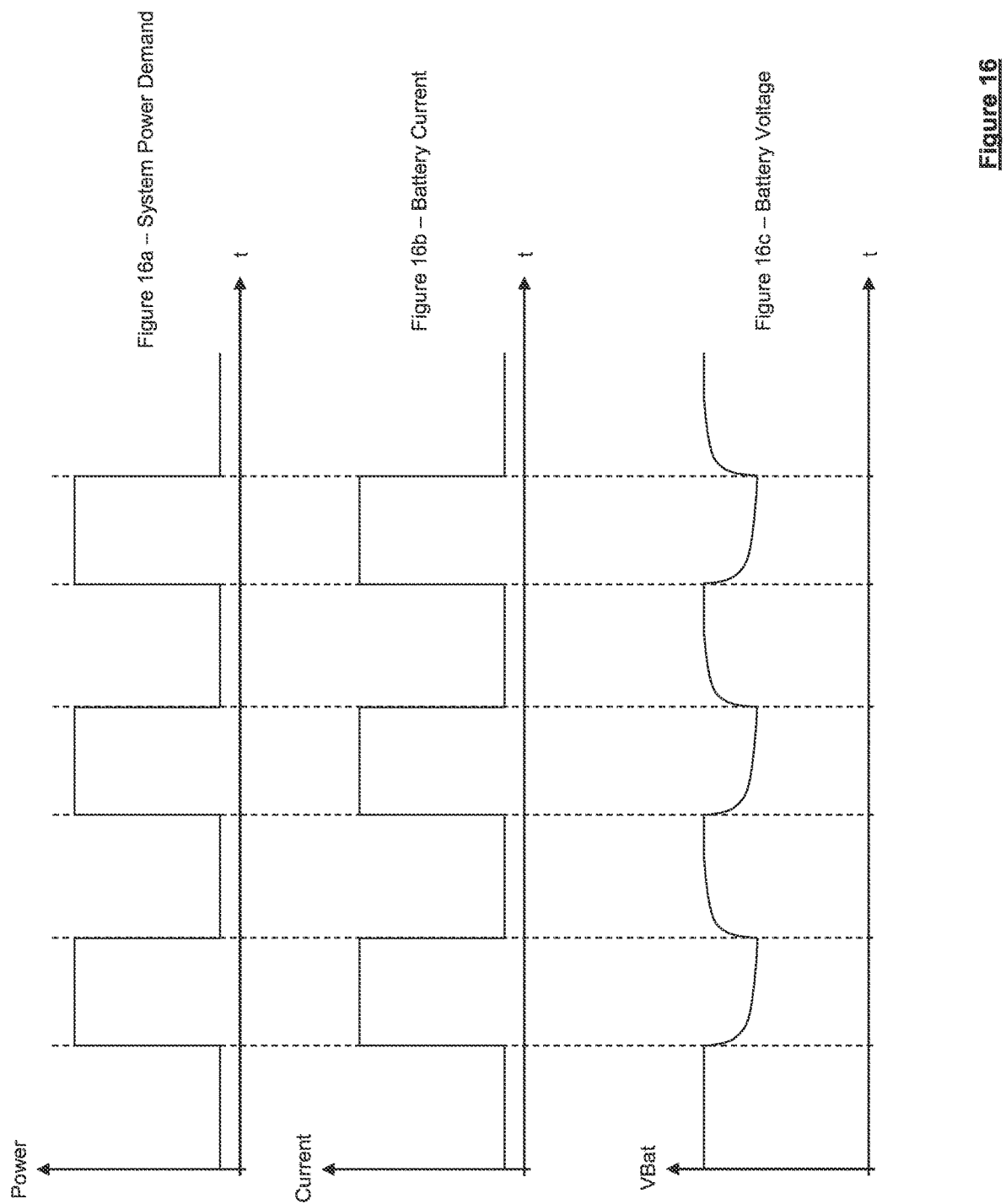
FIG. 16 shows illustrative waveforms showing transducer events for high dynamic loads.

FIG. 16 illustrates an example transducer event (e.g. haptic output) that can demand high dynamic power which may cause the battery power supply to decrease or 'dip'. By estimating the signal power for any and each transducer based on one or more lookahead signals and/or load characteristics and with a measure of: the current battery supply level; supply decoupling capacitance; and/or using a knowledge of the battery RC dynamics (based on some or all battery parameters such as state-of-charge, state-of-health and temperature etc.), the future supply voltage $VBat_F$ can be predicted. This information can be used to limit the output transducer(s) signal power by adjusting one or more parameters of the signal(s), by attenuating the signal level(s) for example, before it is applied to its respective load(s) so as, for example, to avoid a brownout condition and/or to compensate for supply transients to give a consistent output power level(s) and/or to reduce on-chip/system thermal heating.

Figure 17:
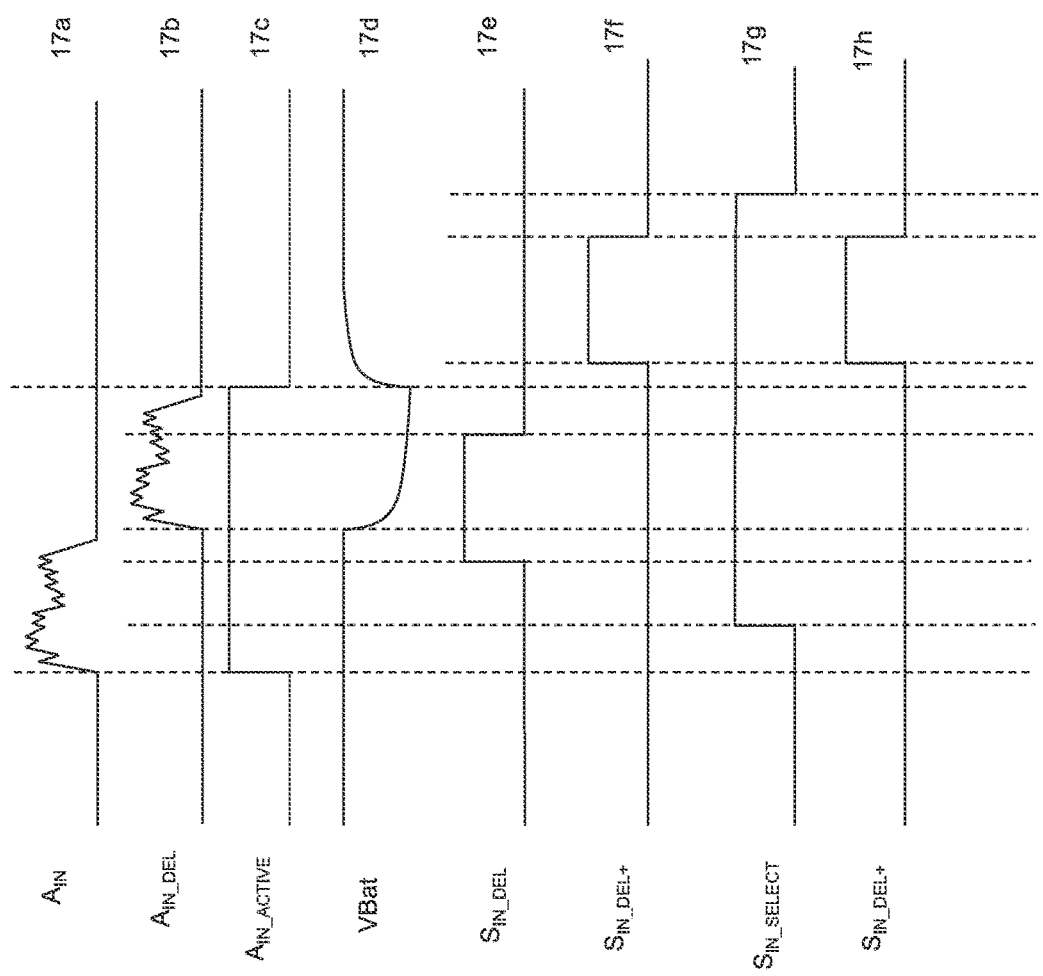
FIG. 17 illustrates delaying a signal to a transducer.

Referring to FIG. 17, if there is sufficient lookahead of the transducer output signals PWMOut-X, AnalogueOut-X, then transient events may be able to be avoided entirely by skewing respective transducer output signals PWMOut-X, AnalogueOut-X. In the case where a transducer output signal can be additionally adjusted, i.e. further delayed, by a small duration (by adding further latency to the signal) without causing any, or any appreciable, user impact, there exists the opportunity to output the additionally delayed signal without signal conditioning, control or adjustment if this coincides with one or more other transducer outputs being in a lower power favourable state. This signal delaying or skewing is preferably applied before the application of the signal to the transducer rather than during the application of the signal to the transducer. If the signal is skewed or delayed, then the skewed/delayed representation must be used in ongoing power predictions. In the example illustrated in FIG. 17, the additionally delayed signal $S_{IN\_DEL+}$ is used in favour of $S_{IN\_DEL}$ as transducer associated with the input signal $A_{IN}$ is at a favourable low power state.

As will be apparent from the foregoing discussion, the circuitry of the present disclosure provides a mechanism for dynamically compensating for changes in the supply voltage applied to digital output driver circuitry, such that the average voltage (or, equivalently, the average power) supplied to load (e.g. a transducer or electronic circuitry) driven by the digital output driver circuitry per period remains substantially constant for a required state of operation of the load, thus maintaining a consistent load output. The circuitry of the present disclosure is able to compensate for both transient changes in the available supply voltage (which may arise, for example, as a result of current being drawn from a power supply by other components or subsystems of a host device that incorporates the digital output driver circuitry) and for longer term changes in the available supply voltage (which may arise, for example, due to discharge of a battery over time).

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances, the device could be an accessory device such as a headset, headphones, earphones, earbuds, or the like, to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the embodiment(s), and that those skilled in the art will be able to design many alternative embodiments without departing from the scope of the appended claims. The word "comprising" does not exclude the presence of elements or steps other than those listed in a claim, "a" or "an" does not exclude a plurality, a single feature or other unit may fulfil the functions of several units recited in the claims; and circuitry is intended to encompass the use of hardware, firmware and/or software, including combinations thereof. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry receiving a voltage derived from a voltage supply for controlling one or more signal paths comprising a controller configured to receive:
   voltage data relating to said circuitry; and/or
   thermal data relating to said circuitry; and/or
   signal data from said one or more signal paths, wherein each signal path comprises a respective transducer driver,
wherein the circuitry is configured to output control data to said one or more signal paths for controlling one or more characteristics of respective signals in said one or more respective signal paths, wherein the controller is a predictive controller for controlling, based on one or more of said received data, one or more characteristics of the respective signals in said one or more respective signal paths before they are output from their respective transducer drivers so as to mitigate or avoid an adverse voltage and/or thermal and/or signal condition relating to said circuitry.

2. Circuitry according to claim 1, wherein the adverse voltage condition is a voltage supply brownout condition.

3. Circuitry according to claim 1, wherein the adverse thermal condition is an undesirable thermal heating of said circuitry.

4. Circuitry according to claim 1, wherein the adverse thermal condition is an undesirable thermal heating of other components or systems of a host device incorporating the circuitry.

5. Circuitry according to claim 1, wherein the voltage data is derived from a battery monitor and/or a voltage monitor.

6. Circuitry according to claim 5, wherein the battery monitor is configured to monitor a battery parameter.

7. Circuitry according to claim 6, wherein the battery parameter comprises one or more of a state of charge of the battery, a state of health of the battery and/or parasitic elements of and/or associated with the battery.

8. Circuitry according to claim 1, wherein the thermal data is derived from one or more thermal monitors.

9. Circuitry according to claim 1, wherein the signal data is derived from one or more points along said one or more signal paths.

10. Circuitry according to claim 1, wherein the control data controls at least one signal parameter in a respective signal path wherein the controlled at least one signal parameter is input to the controller.

11. Circuitry according to claim 1, wherein the control data controls the gain of at least one signal in a respective signal path.

12. Circuitry according to claim 1, wherein the circuitry provides a consistent power output.

13. Circuitry according to claim 1, wherein the controller outputs a total predicted power demand signal.

14. Circuitry according to claim 13, wherein the total predicted power demand signal is input to a battery controller.

15. Circuitry according to claim 1, wherein each respective transducer driver is configured to drive a respective output transducer.

16. Circuitry according to claim 15, wherein each respective output transducer comprises one or more of a motor, a light emitting diode (LED) or LED array, a haptic transducer, a resonant actuator and/or a servo.

17. A device comprising the circuitry of claim 1, wherein the device comprises a battery powered device, a computer game controller, a virtual reality (VR) or augmented reality (AR) device, eyewear, a mobile telephone, a tablet or laptop computer, an accessory device, headphones, earphones or a headset.

18. Circuitry comprising:
one or more signal paths, each of the one or more signal paths being configured to carry a signal for driving a load;
controller circuitry configured to receive data from at least one of the one or more signal paths and to output control data to one or more of the one or more signal paths for controlling one or more characteristics of the signal carried by the one or more of the one or more signal paths;
wherein each of the one or more signal paths comprises transducer driver circuitry.

19. Circuitry according to claim 18, wherein the data received by the controller circuitry from the at least one of the one or more signal paths comprises voltage data and/or thermal data and/or signal data.

20. Circuitry according to claim 18, wherein the controller circuitry comprises lookahead controller circuitry.

21. Circuitry according to claim 18, wherein the one or more signal paths comprise an analogue signal path and/or a digital signal path.

22. Circuitry according to claim 18, wherein the or each transducer driver circuitry is configured to drive a respective output transducer.

23. Circuitry according to claim 22, wherein each respective output transducer comprises one or more of a motor, a light emitting diode (LED) or LED array, a haptic transducer, a resonant actuator and/or a servo.

24. Circuitry according to claim 18, wherein the controller circuitry is configured to output control data to limit a signal power of the load associated with the one or more of the one or more signal paths and/or to delay a signal in one or more of the one or more signal paths and/or to cause attenuation of the signal carried by the one or more of the one or more signal paths.

25. A device comprising the circuitry of claim 18, wherein the device comprises a battery powered device, a computer game controller, a virtual reality (VR) or augmented reality (AR) device, eyewear, a mobile telephone, a tablet or laptop computer, an accessory device, headphones, earphones or a headset.

26. Circuitry comprising:
one or more signal paths, each of the one or more signal paths being configured to carry a signal for driving a load;
controller circuitry configured to receive data from at least one of the one or more signal paths and to output control data to one or more of the one or more signal paths for controlling one or more characteristics of the signal carried by the one or more of the one or more signal paths;
wherein the controller circuitry is configured to output control data to limit a signal power of the load associated with the one or more of the one or more signal paths and/or to delay a signal in one or more of the one or more signal paths and/or to cause attenuation of the signal carried by the one or more of the one or more signal paths.

* * * * *